(12) United States Patent
Hirose et al.

(10) Patent No.: US 8,834,631 B2
(45) Date of Patent: Sep. 16, 2014

(54) PROCESSING APPARATUS AND VALVE OPERATION CHECKING METHOD

(71) Applicant: Tokyo Electron Limited, Tokyo (JP)

(72) Inventors: Katsuhito Hirose, Yamanashi (JP); Toshio Miyazawa, Yamanashi (JP); Toshiharu Hirata, Yamanashi (JP); Toshimasa Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/742,712

(22) Filed: Jan. 16, 2013

(65) Prior Publication Data

US 2013/0183443 A1  Jul. 18, 2013

(30) Foreign Application Priority Data

Jan. 16, 2012 (JP) ................................. 2012-006161
Nov. 29, 2012 (JP) ................................. 2012-261339

(51) Int. Cl.
| | |
|---|---|
| C23C 16/52 | (2006.01) |
| C23C 16/455 | (2006.01) |
| G01M 13/00 | (2006.01) |
| H03K 21/02 | (2006.01) |
| F16K 37/00 | (2006.01) |
| H03K 21/00 | (2006.01) |

(52) U.S. Cl.
CPC ........... *C23C 16/51* (2013.01); *C23C 16/45561* (2013.01); *G01M 13/00* (2013.01); *H03K 21/023* (2013.01); *F16K 37/00* (2013.01); *H03K 21/00* (2013.01); *C23C 16/45544* (2013.01)

USPC ........ 118/715; 118/699; 118/712; 427/248.1; 377/20; 377/865

(58) Field of Classification Search
USPC ......................... 118/699, 712, 715; 73/865.9; 427/247.1; 137/486, 487.5, 613
See application file for complete search history.

(56) References Cited

U.S. PATENT DOCUMENTS

| | | | |
|---|---|---|---|
| 7,735,452 | B2 | 6/2010 | Spartz |
| 2002/0127745 | A1 | 9/2002 | Lu et al. |
| 2003/0143747 | A1 | 7/2003 | Bondestam et al. |

FOREIGN PATENT DOCUMENTS

| | | |
|---|---|---|
| JP | 2002-329674 | 11/2002 |
| JP | 2003-286575 | 10/2003 |
| JP | 2010-153420 | 7/2010 |
| KR | 10-2007-0023387 | 2/2007 |

*Primary Examiner* — Jeffrie R Lund
*Assistant Examiner* — Satish Chandra
(74) *Attorney, Agent, or Firm* — Oblon, Spivak, McClelland, Maier & Neustadt, L.L.P.

(57) ABSTRACT

A processing apparatus includes a processing chamber configured to accommodate a target object to be processed, gas supply paths provided in a corresponding relationship with the kinds of process gases supplied into the processing chamber, and valves respectively arranged in the gas supply paths to open and close the gas supply paths. The processing apparatus further includes valve drive units configured to independently drive the valves, sensor units configured to independently monitor opening and closing operations of the valves, and a control unit configured to determine operation statuses of the valves based on valve opening and closing drive signals transmitted to the valve drive units and/or valve opening and closing detection signals transmitted from the sensor units.

13 Claims, 17 Drawing Sheets

PROCESSING APPARATUS AND VALVE OPERATION CHECKING METHOD

CROSS-REFERENCE TO RELATED APPLICATIONS

This application claims priority to Japanese Patent Application No. 2012-006161 filed on Jan. 16, 2012 and Japanese Patent Application No. 2012-261339 filed on Nov. 29, 2012, the entire contents of which are incorporated herein by reference.

FIELD OF THE INVENTION

The present invention relates to a processing apparatus for performing a film forming process or the like by supplying a processing gas on a target object to be processed, e.g., a semiconductor wafer, and a valve operation checking method for checking an operation status of a valve in the processing apparatus to detect or prevent an abnormality.

BACKGROUND OF THE INVENTION

In a manufacturing process of a semiconductor device, a target object to be processed such as a semiconductor wafer or the like is repeatedly subjected to various kinds of processing such as a film forming, an etching, a heat treatment and a modification treatment. For example, there is known a CVD (Chemical Vapor Deposition) method to form a thin film on a surface of a semiconductor wafer. In the CVD method, a semiconductor wafer is arranged within a processing chamber of a processing apparatus. A processing gas containing a source gas is introduced into the processing chamber to generate a reaction product. A thin film made of the reaction product is deposited on the surface of the semiconductor wafer.

In recent years, there is also known an ALD (Atomic Layer Deposition) method as a film forming method. In the ALD method, a source gas and a reaction gas are alternately supplied into a processing chamber to form thin films one layer after another each of which has a thickness of atomic level or molecular level. The ALD method can provide a film having a good quality and can accurately control the film thickness. For that reason, the ALD method draws attention as a manufacturing method of a semiconductor device which is becoming more scaled down.

In case where a thin film of, e.g., TiN, is formed by the ALD method, the thin film is deposited by repeatedly performing a series of the following steps i) through iv) for example.

i) A source gas, e.g., a $TiCl_4$ gas, is supplied into a processing chamber, thereby causing $TiCl_4$ to adhere onto a wafer surface.

ii) The inside of the processing chamber is purged by a $N_2$ gas to remove the remaining source gas from the processing chamber.

iii) A reaction gas, e.g., an $NH_3$ gas, is supplied into the processing chamber to react with the $TiCl_4$ adhered onto the wafer surface to thereby form a thin layer of TiN film.

iv) The inside of the processing chamber is purged by a $N_2$ gas to remove the remaining gas from the processing chamber.

In the ALD method, as described in the TiN film formation example above, supplies and cutoffs of different kinds of gases including the source gas need to be intermittently and repeatedly performed within a short period of time. In an ALD apparatus, the supply and cutoff of the gas is performed with an electromagnetic valve, which is provided in a gas supply path through which the gas is supplied to the processing chamber, and is opened and closed by a signal transmitted from a control unit based on a gas supply recipe.

In case of the film forming process performed by the ALD method, as compared with the film forming process performed by the CVD method, the time required in opening and closing the valve once becomes shorter and the opening/closing frequency of the valve becomes extremely high. For that reason, troubles such as failure of the valve and degradation of the valve components can be more frequently made in the ALD method than in the CVD method. In order to satisfactorily perform the film forming process in the ALD method, the changeover of different kinds of gases is required to be precisely controlled. If the opening and closing of the valve is not accurately performed as instructed by the control unit, the possibility of forming a poor film will be increased.

In the ALD apparatus, it is therefore imperative to prevent any occurrence of an abnormality in the valve beforehand. Since the opening and closing speed of the valve is very fast in the ALD apparatus, there is a problem in that a conventional control system has a difficulty in monitoring the opening and closing of the valve on a real time basis to check the operation status of the valve.

In respect of the film forming process performed by the ALD method, Japanese Patent Application Publication No. 2002-329674 (e.g., FIG. 1) (corresponding to U.S. Patent Application Publication No. 2002/0127745A1) describes a valve control system including a programmable logic controller configured in communications with a system control computer and operatively connected to an electrically-controlled valves. In this valve control system, the valve control refresh time is reduced to 10 milliseconds or less.

Japanese Patent Application Publication No. 2010-153420 (e.g., the claims) describes an ALD apparatus including a control device for controlling the opening and closing states of valves and a pattern preparing device for preparing a valve changeover pattern for setting the opening and closing states of the valves. In the ALD apparatus described in JP2010-153420A, the pattern preparing device writes the prepared valve changeover pattern in an internal area of the control device and stores the prepared valve changeover pattern in a storage medium of the pattern preparing device. The control device performs the changeover of the valves based on the valve changeover pattern written in the internal area thereof, writes the opening and closing states of the valves at that time in the internal area thereof and stores the opening and closing states of the valves written in the internal area thereof in the storage medium of the pattern preparing device. With the ALD apparatus described in JP2010-153420A, ex-post monitoring on a valve operation error can be performed.

Japanese Patent Application Publication No. 2003-286575 (e.g., the claims) (corresponding to U.S. Patent Application Publication No. 2003/0143747A1) describes a method in which a monitoring is performed by detecting characteristic parameters such as a pressure in a gas flow path and a valve vibration, and providing a signal indicative of the characteristic parameters as a function of time by a sensor in order to measure changes in gas pulses supplied into a processing chamber in an ALD apparatus.

While JP2002-329674A and JP2010-153420A disclose the ALD apparatuses capable of coping with the high-speed opening and closing of the valves, no consideration is given to how to observe an abnormality of a valve on a real time basis. Further, in JP2003-286575A, a trouble of a valve is indirectly monitored based on the change in the characteristic parameters. Thus, it may be time-consuming to detect the trouble of the valve because the opening and closing of the valve is not directly monitored.

Further, in addition to the hardwarely occurred trouble described above, an error in a software may occur easily in the ALD apparatus coping with the high-speed opening and closing of the valves. For example, in a control unit for controlling the ALD apparatus, a multi-task process in which multiple tasks are carried out at the same time by a plurality of software is performed. In this case, if a task priority in the multi-task process is improperly set, the opening/closing timing in a control signal for opening and closing the chamber valve 37 at a high speed may not correspond to the opening/closing timing set by the recipe, so that the opening/closing operation of the valves is delayed in the actual operation, which makes it difficult to realize a highly reliable ALD process.

SUMMARY OF THE INVENTION

In view of the above, the present invention provides a processing apparatus and a valve operation checking method capable of detecting on a real time basis or preventing in advance occurrence of an abnormality of a valve by checking an operation status of the valve in a gas supply system for supplying a gas into a processing chamber.

In accordance with a first aspect of the present invention, there is provided a processing apparatus including: a processing chamber configured to accommodate a target object to be processed; gas supply paths provided in a corresponding relationship with the kinds of process gases supplied into the processing chamber; valves respectively arranged in the gas supply paths to open and close the gas supply paths; valve drive units configured to independently drive the valves; sensor units configured to independently monitor opening and closing operations of the valves; and a control unit configured to determine operation statuses of the valves based on valve opening and closing drive signals transmitted to the valve drive units and/or valve opening and closing detection signals transmitted from the sensor units.

In accordance with a second aspect of the present invention, there is provided a valve operation checking method for use with a processing apparatus, which includes a processing chamber configured to accommodate a target object to be processed; gas supply paths provided in a corresponding relationship with the kinds of process gases supplied into the processing chamber; valves respectively arranged in the gas supply paths to open and close the gas supply paths; valve drive units configured to independently drive the valves; sensor units configured to independently monitor opening and closing operations of the valves; and a control unit configured to determine operation statuses of the valves.

The method includes determining, by the control unit, the operation statuses of the valves based on valve opening and closing drive signals transmitted to the valve drive units and/or valve opening and closing detection signals transmitted from the sensor units.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

Hereinafter, embodiments of the present invention will be described in detail with reference to the accompanying drawings which form a part hereof.

1. First Embodiment

Configuration Example of Film Forming Apparatus

Figure 1:
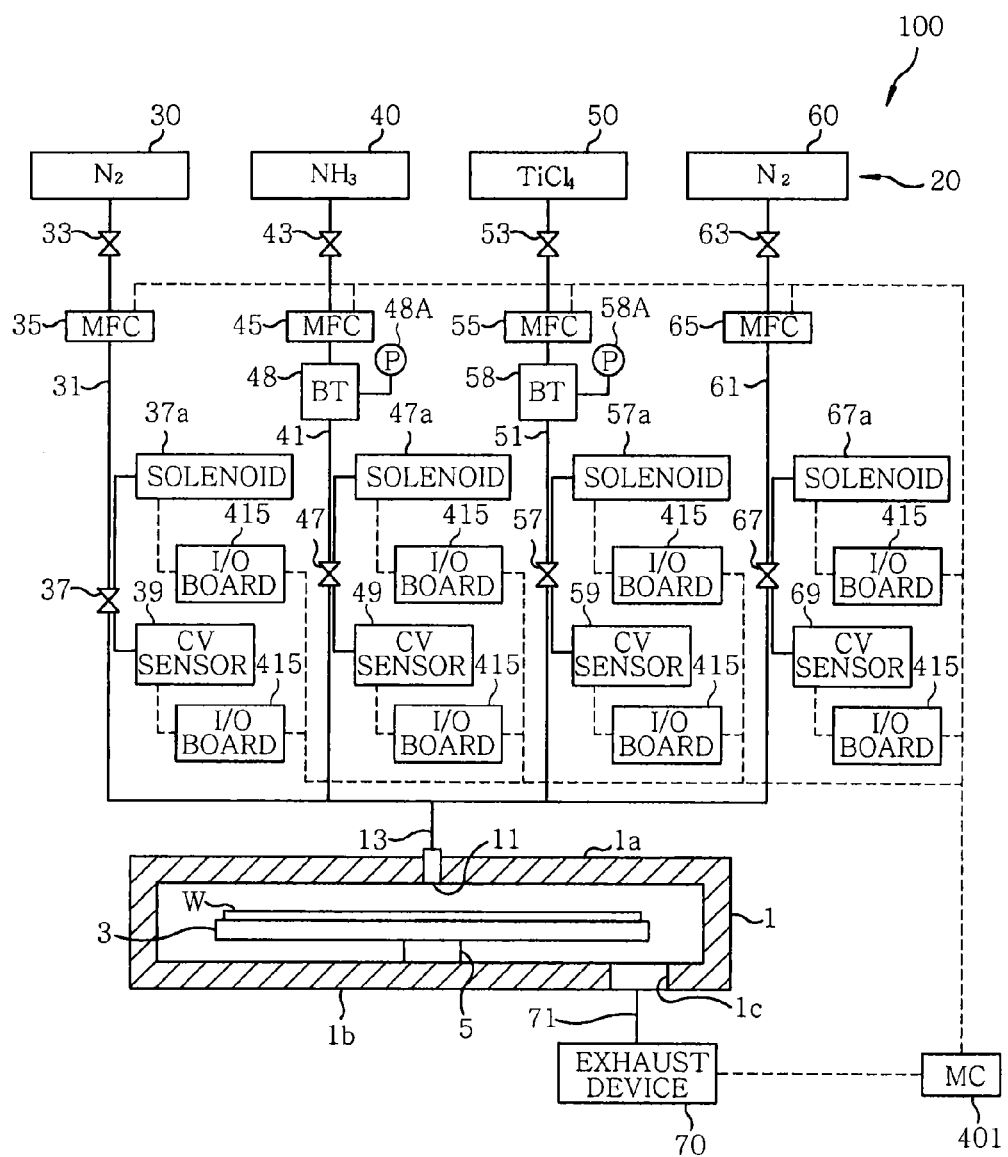
FIG. 1 is an explanatory view showing a schematic configuration of a film forming apparatus in accordance with a first embodiment of the present invention.

First, a processing apparatus in accordance with a first embodiment of the present invention will be described with reference to FIG. 1. FIG. 1 shows a schematic configuration of a film forming apparatus 100 of the first embodiment configured to perform a film forming process on a substrate, e.g., a semiconductor wafer W by using an ALD method. The film forming apparatus 100 includes a hermetically sealed processing chamber 1 of a substantially cylindrical shape. In the processing chamber 1, there is provided a susceptor 3 for horizontally supporting the wafer W as a target object to be processed. The susceptor 3 is supported by a cylindrical support member 5. A heater (not shown) is embedded in the susceptor 3. The wafer W is heated to a predetermined temperature by feeding electric power to the heater.

A gas introduction unit 11 is provided at a ceiling wall 1a of the processing chamber 1. A gas injection hole (not shown) is formed in the gas introduction unit 11. A pipe 13 as a gas supply path is connected to the gas introduction unit 11. Pipes 31, 41, 51 and 61 are joined to the pipe 13 and are connected to a gas supply source 20 for supplying source gases.

In the film forming apparatus 100 shown in FIG. 1, a TiN film is formed on a surface of the wafer W through an ALD method. In this case, the gas supply source 20 includes a $N_2$ gas supply source 30 as a purge gas supply source, an $NH_3$ gas supply source 40 as a reaction gas supply source and a $TiCl_4$ gas supply source 50 as a source gas supply source and a $N_2$ gas supply source 60 as another purge gas supply source.

The $N_2$ gas supply source 30 is connected to the gas introduction unit 11 through the pipes 31 and 13. A valve 33, a mass flow controller (MFC) 35 for controlling a gas flow rate and a chamber valve 37 are arranged in the pipe 31.

The $NH_3$ gas supply source 40 is connected to the gas introduction unit 11 through the pipes 41 and 13. A valve 43, a mass flow controller (MFC) 45 for controlling a gas flow rate and a chamber valve 47 are arranged in the pipe 41. In the pipe 41, a buffer tank (BT) 48 is arranged near the $NH_3$ gas supply source 40 at the upstream side of the chamber valve 47 along a gas supply direction. A pressure gauge 48A for measuring the internal pressure of the buffer tank 48 is attached to the buffer tank 48.

The $TiCl_4$ gas supply source 50 is connected to the gas introduction unit 11 through the pipes 51 and 13. The $TiCl_4$ gas supply source 50 is provided with a vaporizer (not shown). A valve 53, a mass flow controller (MFC) 55 for controlling a gas flow rate and a chamber valve 57 are arranged in the pipe 51. In the pipe 51, a buffer tank (BT) 58 is arranged near the $TiCl_4$ gas supply source 50 at the upstream side of the chamber valve 57 along the gas supply direction. A pressure gauge 58A for measuring the internal pressure of the buffer tank 58 is attached to the buffer tank 58.

The $N_2$ gas supply source 60 is connected to the gas introduction unit 11 through the pipes 61 and 13. A valve 63, a mass flow controller (MFC) 65 for controlling a gas flow rate and a chamber valve 67 are arranged in the pipe 61.

The chamber valves 37, 47, 57 and 67 are arranged closest to the processing chamber 1 in the respective pipes 31, 41, 51 and 61. When the chamber valves 37, 47, 57 and 67 are opened, the respective gases are introduced into the processing chamber 1. When the chamber valves 37, 47, 57 and 67 are closed, the supplies of the respective gases into the processing chamber 1 are stopped.

Each of the chamber valves 37, 47, 57 and 67 is an electromagnetic valve (solenoid valve) that can be opened and closed at a high speed. In FIG. 1, for the sake of convenience in description, solenoids 37a, 47a, 57a and 67a respectively serving as valve drive units are shown in a corresponding relationship with the chamber valves 37, 47, 57 and 67. The solenoids 37a, 47a, 57a and 67a are components included in the respective chamber valves 37, 47, 57 and 67, respectively.

Sensor units serving as chamber valve sensors (CV sensors) 39, 49, 59 and 69 each of which includes, e.g., a position sensor, are arranged respectively in the chamber valves 37, 47, 57 and 67. The CV sensors 39, 49, 59 and 69 monitor the opening and closing states of the chamber valves 37, 47, 57 and 67 operated by the solenoids 37a, 47a, 57a and 67a, respectively.

While the reaction gas supply source, the source gas supply source and the purge gas supply source are provided in the film forming apparatus 100 shown in FIG. 1, the gas supply source 20 may further include other gas supply sources, e.g., a cleaning gas supply source for cleaning the inside of the processing chamber 1. In this case, a pipe and a valve are provided in a corresponding relationship with each of the other gas supply sources.

An exhaust port 1c is formed in a bottom wall 1b of the processing chamber 1. An exhaust device 70 is connected to the exhaust port 1c through an exhaust pipe 71. The inside of the processing chamber 1 can be depressurized to a predetermined vacuum level by operating the exhaust device 70.

Configuration Example of Control System

Next, a control system for the film forming apparatus 100 will be briefly described with reference to FIGS. 1 to 3. As will be described later, the film forming apparatus 100 is controlled by a module controller (MC) 401 to perform a predetermined process in the processing chamber 1.

Figure 2:
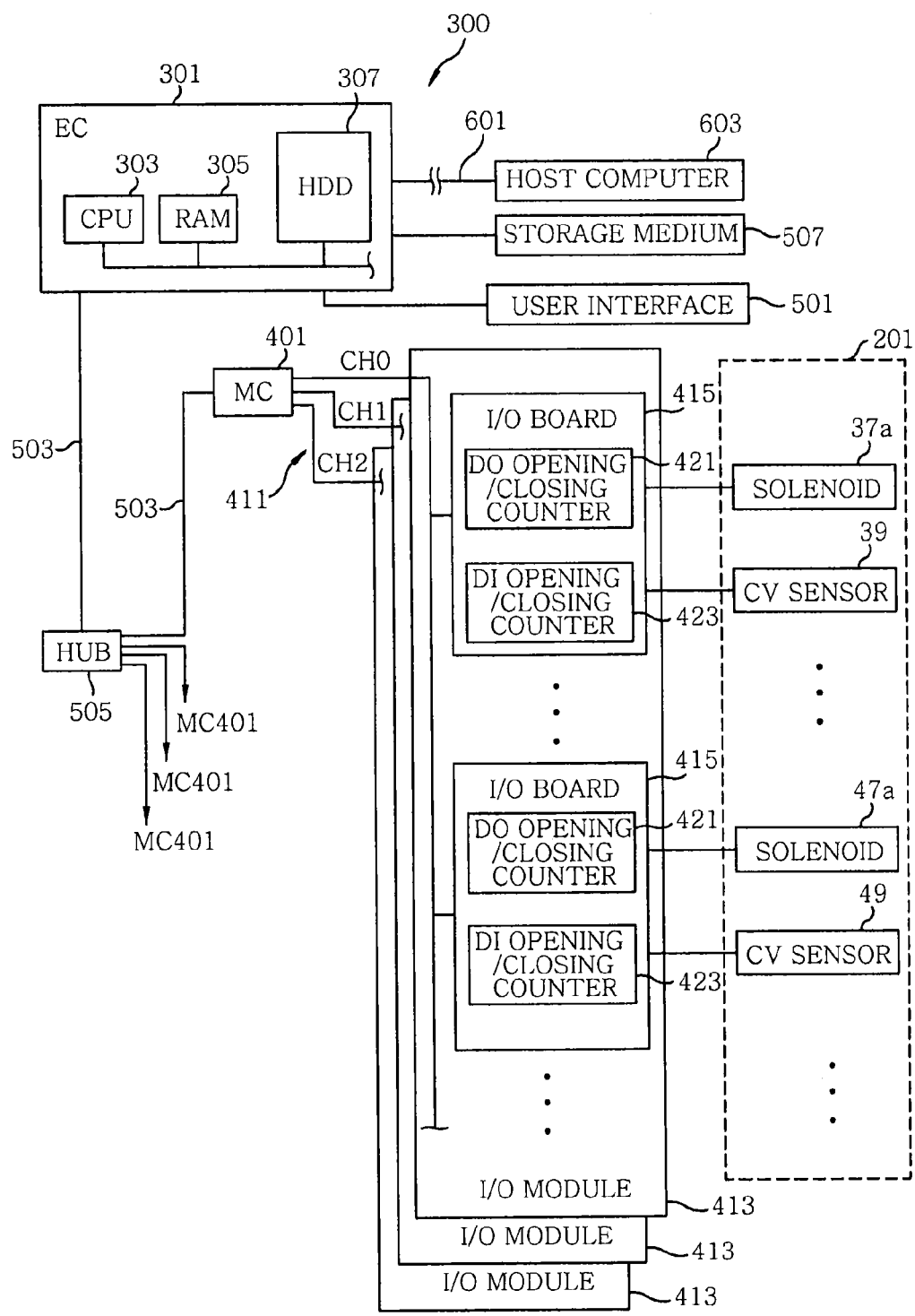
FIG. 2 is an explanatory view showing a schematic configuration of a control system for a substrate processing system including the film forming apparatus of the first embodiment.
Figure 3:
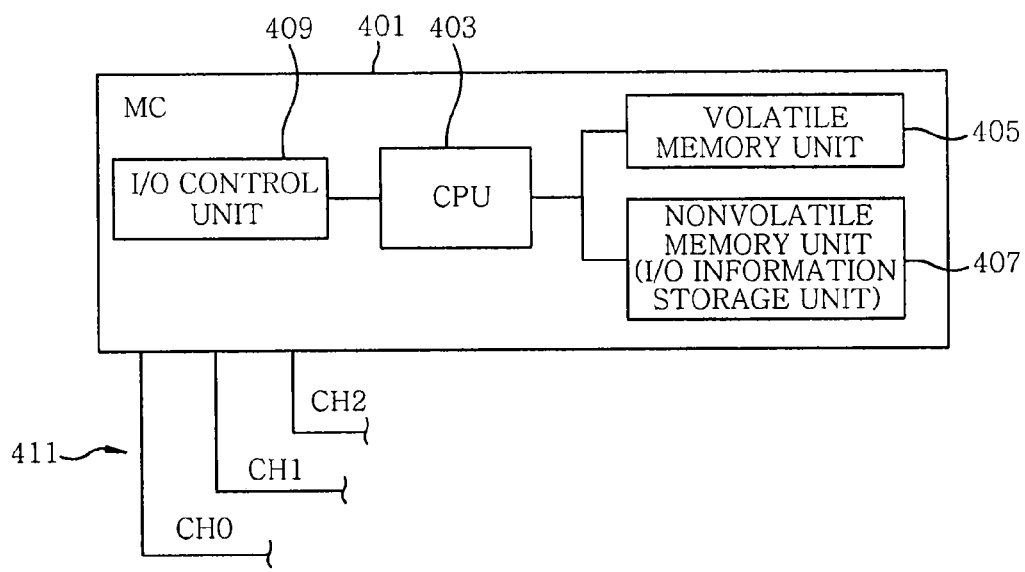
FIG. 3 is an explanatory view showing a schematic configuration of a module controller.

FIG. 2 schematically shows a part of the control system for a substrate processing system (not shown) including the film forming apparatus 100, which relates to the control of the film forming apparatus 100 for performing an ALD process. The entire control of the substrate processing system and the control of the respective component parts, i.e., the end devices 201, included in the film forming apparatus 100 serving as a process ship, are performed by a control unit 300. Examples of the end devices 201 may include the chamber valves 37, 47, 57 and 67 (the solenoids 37a, 47a, 57a and 67a), the mass flow controllers 35, 45, 55 and 65, the CV sensors 39, 49, 59 and 69 and the exhaust device 70 of the film forming apparatus 100 shown in FIG. 1.

As shown in FIG. 2, the control unit 300 includes, as its major components, a plurality of module controllers (MC) 401 as individual control units provided in a corresponding relationship with the respective processing apparatuses of the substrate processing system including the film forming apparatus 100, an equipment controller (EC) 301 serving as a general control unit for controlling the entire substrate processing system and a user interface 501 connected to the equipment controller 301. The module controllers 401 may be provided not only in the film forming apparatus 100 but also in, e.g., other processing apparatuses, a load-lock chamber and a loader unit of the substrate processing system. These module controllers 401 are also controlled under the control of the equipment controller 301, but it will not be shown and described herein.

(Equipment Controller)

The equipment controller 301 is a general control unit for generally managing the respective module controllers 401 to control the overall operations of the substrate processing system. The equipment controller 301 includes a central processing unit (CPU) 303, a random access memory (RAM) 305 as a volatile memory, and a hard disk device (HDD) 307 as a storage unit. The equipment controller 301 and each module controller 401 are connected through an in-system local area network (LAN) 503. The in-system LAN 503 includes a switching hub 505. Responsive to a control signal supplied from the equipment controller 301, the switching hub 505 performs the changeover of the module controllers 401 as connection destinations of the equipment controller 301.

The equipment controller 301 is connected through a LAN 601 to a host computer 603 serving as a manufacturing execution system (MES), which manages the overall manufacturing processes in a factory in which the substrate processing system is installed. In cooperation with the control unit 300, the host computer 603 feeds back the real-time information on each process in the factory to a backbone system (not shown) and makes a judgment on the process in view of the loads in the factory as a whole.

The user interface 501 is connected to the equipment controller 301. The user interface 501 includes a keyboard through which a process manager inputs a command or the like to manage the substrate processing system, a display unit for visually displaying the operational status of the substrate processing system, a mechanical switch, and so forth.

The equipment controller 301 is configured to store information in a computer-readable storage medium (hereinafter just referred to as "storage medium") 507 and to read out the information from the storage medium 507. A control program and a recipe stored in, e.g., the storage medium 507, can be used by installing them in the hard disk device 307 serving as a storage unit. As an example of the storage medium 507, it is possible to use, e.g., a CD-ROM, a hard disk, a flexible disk, a flash memory and a DVD. The recipe may be used online by frequently transmitting from other devices through, e.g., a dedicated line.

In the equipment controller 301, the CPU 303 reads out the program (software) including the recipe on a processing method of a wafer W from the hard disk device 307 or the storage medium 507, the processing method being designated by a user through the user interface 501. Then, the program is transmitted from the equipment controller 301 to the respective module controllers 401, whereby the respective module controllers 401 can control the processing performed in the processing apparatuses including the film forming apparatus 100. Description will now be made on the relationship between the film forming apparatus 100 and the module controller 401 for controlling the film forming apparatus 100.

(Module Controller)

The module controller 401 is provided as an individual control unit for controlling the operation of the film forming apparatus 100. As shown in FIG. 3, the module controller 401 includes a central processing unit (CPU) 403, a volatile memory unit 405 such as a RAM or the like, a nonvolatile memory unit 407 serving as an I/O information storage unit, and an I/O control unit 409.

The nonvolatile memory unit 407 in the module controller 401 is formed of a nonvolatile memory such as a static random access memory (SRAM), a magnetic random access memory (MRAM), an electrically erasable and programmable read-only memory (EEPROM) or a flash memory. Various kinds of history information in the film forming apparatus 100, e.g., a replacement time of the heater in the susceptor 3 and an operating time of the exhaust device 70, are stored in the nonvolatile memory unit 407. The nonvolatile memory unit 407 serves as an I/O information memory unit. As will be described later, various kinds of I/O information between the module controller 401 and the respective end devices 201 (especially, digital output information DO and analog output information AO) are frequently written on and stored in the nonvolatile memory unit 407.

(I/O Module)

The I/O control unit 409 in the module controller 401 transmits various kinds of control signals to I/O (input/output) modules 413 and receives a signal indicative of status information on the respective end devices 201 from the I/O modules 413 and the like. The respective end devices 201 are controlled by the module controller 401 through the I/O modules 413. The I/O modules 413 transfer the control signals from the module controller 401 to the respective end devices 201 and the input signals from the respective end devices 201 to the module controller 401. The module controller 401 is connected to the I/O modules 413 through a network 411. The network 411 connected to the module controller 401 includes a plurality of channels, e.g., channels CH0, CH1 and CH2.

Each of the I/O modules 413 includes a plurality of I/O boards 415 connected to the respective end devices 201 included in the film forming apparatus 100. The I/O boards 415 are a lower-hierarchy control device operating under the control of the module controller 401. The input and output of digital signals, analog signals and serial signals in the I/O modules 413 are controlled by the I/O boards 415. For the sake of convenience, only the connections of the I/O boards 415 to some of the end devices 201 (the solenoids 37a and 47a) and the CV sensors 39 and 49 are representatively shown in FIGS. 1 and 2.

The input/output information managed by the I/O boards 415 includes four kinds of information, namely digital input information DI, digital output information DO, analog input information AI and analog output information AO. The digital input information DI is the digital information inputted from each of the end devices 201, which is a lower-hierarchy device in the control system, to the module controller 401, which is a higher-hierarchy device in the control system. The digital output information DO is the digital information outputted from the module controller 401, which is a higher-hierarchy device in the control system, to each of the end devices 201, which is a lower-hierarchy device in the control system. The analog input information AI is the analog information inputted from each of the end devices 201 to the module controller 401. The analog output information AO is the analog information outputted from the module controller 401 to each of the end devices 201.

The digital input information DI and the analog input information AI contain, e.g., the information on the statuses of the respective end devices 201. The digital output information DO and the analog output information AO contain, e.g., the setting values on the process conditions and the like and the commands, which are outputted to each of the end devices 201. Examples of the digital information include the information on the opening and closing of each of the chamber valves 37, 47, 57 and 67 (the solenoids 37a, 47a, 57a and 67a), the information on the on/off operation of the exhaust device 70 and the information on the opening and closing of valves (not shown) of an exhaust system. Examples of the analog information include the information on the setting temperature of a heater (not shown) in the susceptor 3 and the information on the setting gas flow rates of the mass flow controllers 35, 45, 55 and 65.

I/O addresses are respectively assigned to the four kinds of input/output information DI, DO, AI and AO in a corresponding relationship with contents thereof. Each of the I/O addresses contains digital information or analog information of, e.g., 16 bits (0 to 15). The analog information is indicated by, e.g., a hexadecimal number of 0 to FFF. I/O address numbers (Addr) are allotted to the I/O addresses. As stated earlier, the network 411 connected to the module controller 401 has a plurality of channels, e.g., a channel CH0, a channel CH1 and a channel CH2. Node numbers (Node) starting from numeral 1 are allotted to the respective I/O boards 415.

Accordingly, the I/O addresses assigned to the four kinds of input/output information DI, DO, AI and AO can be specified by three kinds of parameters, namely the channel numbers, the node numbers (Node) from 1 to n (where n is an integer) and the I/O address numbers (Addr). Details of the input/output information will not be shown and described.

(Counter Unit)

The film forming apparatus 100 of the present embodiment includes two kinds of counter units serving as a valve opening/closing drive signal counting unit and a valve opening/closing detection signal counting unit. The two kinds of counter units are arranged in the I/O boards 415.

The first kind of counter unit is a DO opening/closing counter 421 (first counter unit) for receiving a feedback DI signal of a drive DO signal (a command signal) (a CV solenoid DO signal) including one or more valve opening/closing drive signals of each of the solenoids 37a, 47a, 57a and 67a in the chamber valves 37, 47, 57 and 67 and counting the number of the valve opening/closing drive signals for each of the solenoids 37a, 47a, 57a and 67a (namely, the number of the drive signals for the opening/closing of each of the chamber valves 37, 47, 57 and 67). In FIG. 2, the I/O boards 415 having the DO opening/closing counters 421 for the solenoids 37a and 47a are representatively illustrated.

The second kind of counter unit is a DI opening/closing counter 423 (second counter unit) for receiving a DI signal including one or more valve opening/closing detection signals from each of the CV sensors 39, 49, 59 and 69 respectively attached to the chamber valves 37, 47, 57 and 67 and counting the number of the valve opening/closing detection signals for each of the chamber valves 37, 47, 57 and 67. In FIG. 2, the I/O boards 415 having the DI opening/closing counters 423 for the CV sensors 39 and 49 are representatively illustrated. These two kinds of counter units are provided by installing a firmware, e.g., a field programmable gate array (FPGA) on each of the I/O boards 415. Details of the DO opening/closing counter 421 and the DI opening/closing counter 423 will be described later.

In the control unit 300 configured as above, the I/O boards 415 connected to the end devices 201 are modularized into an I/O module 413. The I/O module 413 is connected to the equipment controller 301 through the module controller 401 and the switching hub 505. In this manner, the end devices 201 are not directly connected to the equipment controller 301 but are connected to the equipment controller 301 through the I/O module 413 and the module controller 401, thereby realizing a control system hierarchy.

Further, in the present embodiment, while maintaining the basic configuration of the control system in which the equipment controller 301, the module controller 401, the I/O module 413 and the end devices 201 are arranged in the order of hierarchy from high to low, it is configured such that the DO opening/closing counter 421 and the DI opening/closing counter 423 are provided in each of the I/O boards 415, which is a lower-hierarchy device compared to the module controller 401, to count the number of the opening/closing drive signals and the number of the opening/closing detection signals for each of the chamber valves 37, 47, 57 and 67. In other words, the number of the opening/closing drive signals and the number of the opening/closing detection signals for each of the chamber valves 37, 47, 57 and 67 are counted by using the lower-hierarchy control device closer to each of the chamber valves 37, 47, 57 and 67 than the module controller 401, and the module controller 401 is configured to read out the counted results.

Accordingly, while the ALD process is performed in the film forming apparatus 100, it is not necessary for the module controller 401 to check the opening/closing states of the chamber valves 37, 47, 57 and 67, which are opened and closed at a high speed, every single time the chamber valves are opened and closed. It is only necessary to check the counted numbers of the DO and the DI opening/closing counters 421 and 423 accumulated during every specified time period in the ALD process, e.g., every specified frequency of cycles, every arbitrary step or every time when a process of one wafer W is completed.

This makes it possible to accurately check the opening/closing operations of the valves without having to apply high load to the module controller 401.

<ALD Process>

In the film forming apparatus 100, a wafer W is mounted on the susceptor 3. Then, a process gas is supplied through the gas introduction unit 11 toward the wafer W while the wafer W being heated by a heater (not shown). Thus, a specified thin film can be formed on the surface of the wafer W through an ALD method. For example, when forming a TiN film through an ALD method, it is possible to deposit a thin film by repeatedly performing a plurality of cycles each including steps 1) through 7) noted below.

An ALD process of one cycle includes the following steps.

1) The chamber valve 57 is opened and the $TiCl_4$ gas as a source gas is supplied from the $TiCl_4$ gas supply source 50 into the processing chamber 1, thereby causing $TiCl_4$ to adhere onto the wafer W.

2) The chamber valve 57 is closed and the supply of the $TiCl_4$ gas is stopped.

3) The chamber valve 67 is opened and the $N_2$ gas is introduced from the $N_2$ gas supply source 60 into the processing chamber 1 to purge the inside of the processing chamber 1, thereby removing the $TiCl_4$ gas remaining in the processing chamber 1.

4) The chamber valve 67 is closed and the supply of the $N_2$ gas is stopped.

5) The chamber valve 47 is opened and the $NH_3$ gas as a reaction gas is supplied from the $NH_3$ gas supply source 40 into the processing chamber 1. The $NH_3$ gas reacts with $TiCl_4$ adhered onto the surface of the wafer W, thereby forming a thin layer of TiN film.

6) The chamber valve 47 is closed and the supply of the $NH_3$ gas is stopped.

7) The chamber valve 37 is opened and the $N_2$ gas is introduced from the $N_2$ gas supply source 30 into the processing chamber 1 to purge the inside of the processing chamber 1, thereby removing the $NH_3$ gas remaining in the processing chamber 1.

In the ALD process, the aforementioned cycle is repeatedly performed. Thus, in order to satisfactorily perform the film forming process, the supply and cutoff of the gases needs to be intermittently repeated in a short period of time and needs to be accurately carried out. For that reason, the opening/closing frequency of the chamber valves 37, 47, 57 and 67 becomes extremely high, and, therefore, troubles such as a failure of the valves and an operation abnormality caused by degradation of the valve components are more easily made in the ALD process compared to those in the CVD method.

In the ALD process, it is therefore required to rapidly detect or prevent in advance the occurrence of any abnormality in the chamber valves 37, 47, 57 and 67. In the present embodiment, determination on the trouble in the chamber valves 37, 47, 57 and 67 can be made at an early time by providing the DO opening/closing counter 421 and the DI opening/closing counter 423 in the I/O boards 415.

<Detection of Operation status of Chamber Valve>

Figure 4A:
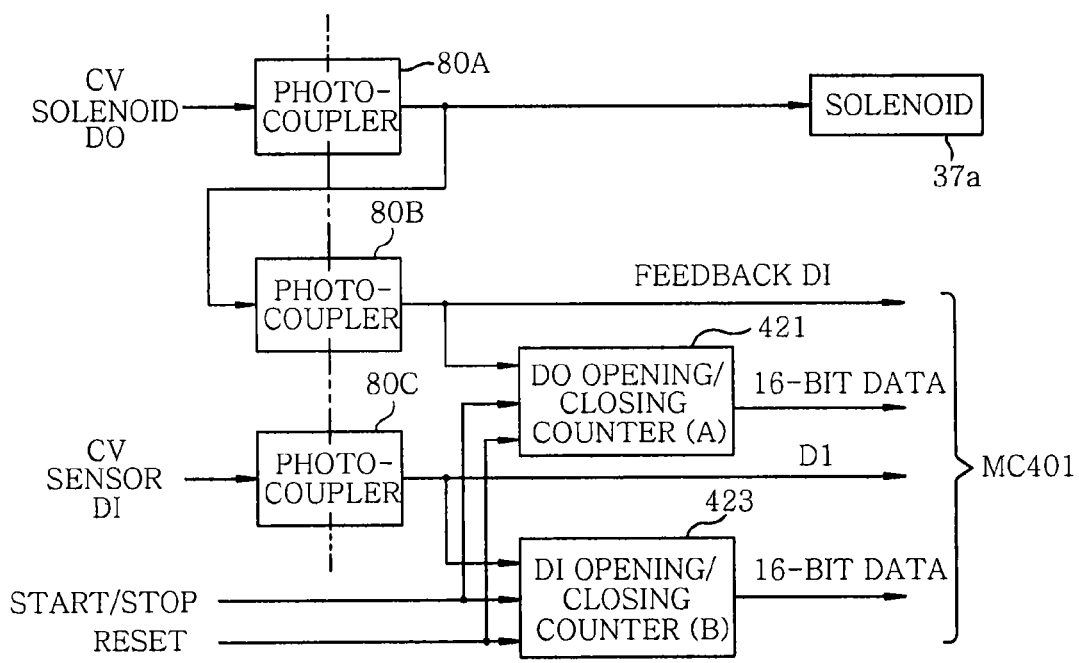
FIG. 4A is an explanatory view partially showing a control system including chamber valve opening/closing counters in accordance with the first embodiment of the present invention.
Figure 4B:
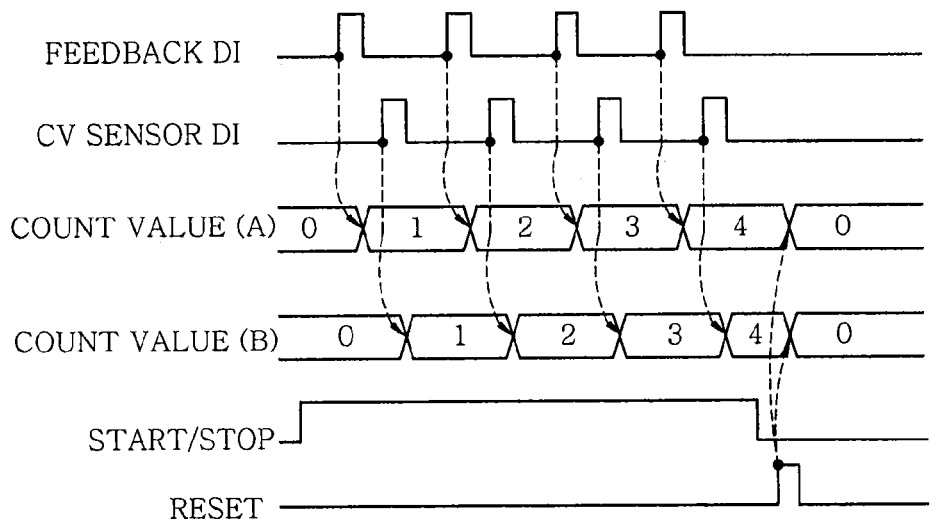
FIG. 4B is a timing chart explaining the principle of counting operations performed by a DO opening/closing counter and a DI opening/closing counter in accordance with the first embodiment of the present invention.

FIG. 4A partially shows a control system for controlling the opening and closing of the chamber valve and a control system for controlling the CV sensor. FIG. 4B is a timing chart illustrating the principle of counting operations performed by the DO opening/closing counter 421 and the DI opening/closing counter 423. In FIG. 4B, there is also illustrated the relationship between the opening/closing drive signals for the chamber valve and the opening/closing detection signals detected by the CV sensor. As a representative example, the chamber valve 37 and the CV sensor 39 will be described herein.

In order to drive the chamber valve 37 while the ALD process is performed in the film forming apparatus 100, the CV solenoid DO signal, which is the digital output information transmitted from the module controller 401, is transferred to the solenoid 37a of the chamber valve 37 through a photo-coupler 80A serving as a signal transfer unit. Concurrently, the CV solenoid DO signal including the valve opening/closing drive signals is fed back, as digital input information DI, to the module controller 401 through a photo-coupler 80B serving as a signal transfer unit. The feedback DI signal is also transmitted to the DO opening/closing counter 421 on the corresponding I/O board 415 and the number of the valve opening/closing drive signals for the chamber valve 37 is counted.

Meantime, while the ALD process is performed in the film forming apparatus 100, the CV sensor 39 transmits a CV sensor DI signal including the valve opening/closing detection signals, each of which is a physical valve opening/closing detection signal, to the module controller 401 as digital input information DI. The CV sensor DI signal is also transmitted to the DI opening/closing counter 423 on the corresponding I/O board 415 and the number of the valve opening/closing detection signals for the chamber valve 37 is counted.

In the timing chart shown in FIG. 4B, a rising edge of a rectangular shape of the feedback DI signal (having the same waveform as the CV solenoid DO signal) indicates a command signal (drive signal) for the opening of the chamber valve 37. The falling edge therein indicates a command signal (drive signal) for the closing of the chamber valve 37. In FIG. 4B, the corresponding relationship between the rising edge in the feedback DI signal and the count value A of the DO opening/closing counter 421 is indicated by dashed-line arrows.

Similarly, the rising edge of the rectangular shape of the CV sensor DI signal denotes a detection signal indicative of the detection of the opening of the chamber valve 37. The falling edge therein denotes a detection signal indicative of the detection of the closing of the chamber valve 37. In FIG. 4B, the corresponding relationship between the rising edge in the CV sensor DI signal and the count value B of the DI opening/closing counter 423 is indicated by dashed-line arrows.

In FIG. 4B, the count value A of the DO opening/closing counter 421 and the count value B of the DI opening/closing counter 423 are equal to four.

Each of the DO opening/closing counter 421 and the DI opening/closing counter 423 is a 16-bit counter. As shown in FIG. 4B, each of the DO opening/closing counter 421 and the DI opening/closing counter 423 starts or stops a counting operation in response to a start or stop command transmitted from the module controller 401. Responsive to a reset command transmitted from the module controller 401, the DO opening/closing counter 421 and the DI opening/closing counter 423 are reset to zero.

In the film forming apparatus 100, the counting operation may be started and stopped in conformity with the start and end of the processing of a single wafer W or may be continuously performed while a predetermined number of wafers W are processed. Alternatively, the counting operation may be started and stopped on an ALD cycle basis or an ALD step basis during the processing of a single wafer W. In this case, an occurrence of abnormality can be detected during the course of processing a single wafer W. The count values of the DO opening/closing counter 421 and the DI opening/closing counter 423 are transmitted to the module controller 401 as 16-bit data.

(Determination Method)

The determination on the operation status of the chamber valve 37 by using the DO opening/closing counter 421 and the DI opening/closing counter 423 can be made in the following manner for example when assuming that X is the number of commands for the opening/closing of the chamber valve 37 (the number of the drive commands for the solenoids 37a) based on a software (recipe) of the module controller 401; A is the count value of the DO opening/closing counter 421; and B is the count value of the DI opening/closing counter 423. This determination can be made through the use of another software (recipe) of the module controller 401.

If $X=A=B$, it is determined that the operation status of the chamber valve 37 is normal. If $X \neq A$, it is determined that there is an abnormality in any of the DO opening/closing counter 421, the CV solenoid DO circuit and the photo-coupler 80A. If $A \neq B$, it is determined that there is an abnormality relating to the chamber valve 37.

In this regard, the term "an abnormality relating to the chamber valve 37" specifically means the trouble occurring in any of the chamber valve 37, the solenoid 37a, the CV sensor 39, the wiring and the pipes 13 and 31 thereof or the like.

If $A \neq B$ and if an abnormality is detected, for example, a notification of such abnormality may be displayed on the display unit of the user interface 501 or the module controller 401 may transmit a control signal to the end devices 201 to stop the ALD process in the film forming apparatus 100.

Further, in case of $A \neq B$, if the difference between the count value A and the count value B (i.e., the difference between the commanded number of the opening/closing of the chamber valve 37 and the detected number of the opening/closing of the chamber valve 37) is equals to or smaller than a predetermined threshold, the ALD process may be continuously performed. On the other hand, if the difference between the count value A and the count value B exceeds the predetermined threshold, it may be determined that the chamber valve 37 is abnormal, and the ALD process may be stopped. This is because in case where the difference between the count value A and the count value B is extremely small, it is considered that the influence of the difference on the ALD process is also small.

The module controller 401 can read the count values during the ALD process (during the counting operation). This makes it possible to detect the operation status of the chamber valve 37 on a real time basis.

Figure 5:
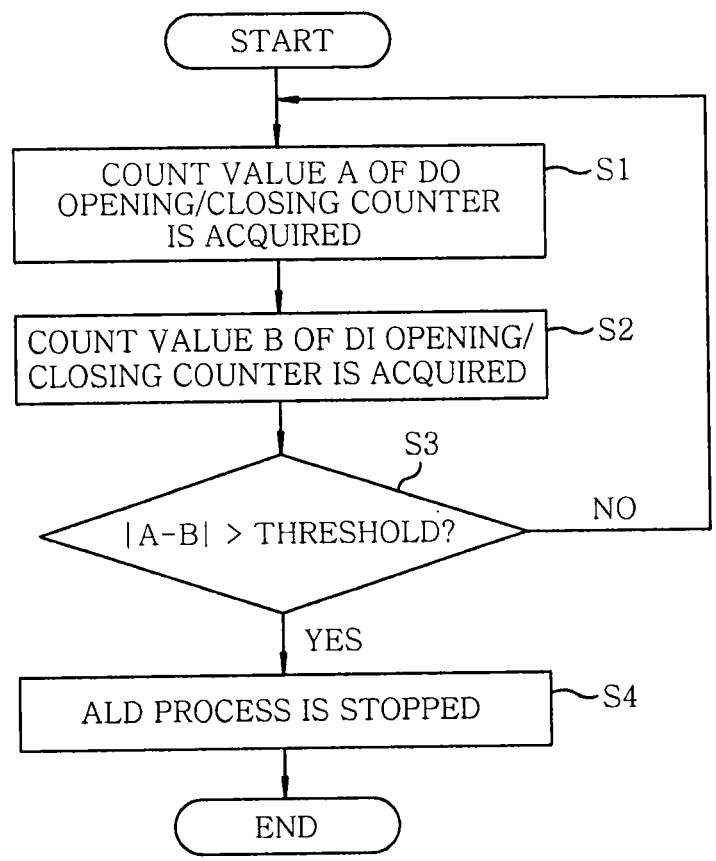
FIG. 5 is an example of a sequence of a valve operation checking method in accordance with the first embodiment of the present invention.

FIG. 5 shows an example of a sequence of the determination method on the operation status of the chamber valve 37 in the present embodiment. The sequence shown in FIG. 5 describes a case where the difference between the count values of the DO opening/closing counter 421 and the DI opening/closing counter 423 is compared with a predetermined threshold.

First, in FIG. 5, the module controller 401 acquires a count value A of the DO opening/closing counter 421 (step S1). Next, the module controller 401 acquires a count value B of the DI opening/closing counter 423 (step S2). Then, in step S3, the module controller 401 calculates the difference between the count values A and B, and it is determined whether or not an absolute value of the difference between the count values A and B is greater than the predetermined threshold. Such calculation and determination in step S3 are carried out by the module controller 401 serving as a determination unit.

The predetermined threshold used in step S3 may be the one that stored in the nonvolatile memory unit 407. Further, the module controller 401 may acquire the count value B of the DI opening/closing counter 423 before acquiring the count value A of the DO opening/closing counter 421. Alternatively, the count values A and B are acquired at the same time by the module controller 401.

If it is determined that the absolute value of the difference between the count values A and B is greater than the threshold (YES in step S3), the module controller 401 transmits a control signal to, e.g., stop an ALD process in step S4. Further, in step S4, another process such as a display of a warning notification on the display unit of the user interface 501 or the like may be carried out without immediately stopping the ALD process.

On the other hand, if it is determined that the absolute value of the difference between the count values A and B is not greater than the threshold (NO in step S3), the process returns back to step S1. Then, the sequence shown in FIG. 5 is repeated, e.g., until a film forming process for a single wafer W is completed or until it is determined that the absolute value of the difference between the count values A and B is greater than the predetermined threshold (YES in step S3).

As described above, in the film forming apparatus 100 of the present embodiment, the directly monitoring target is the opening/closing frequency of the chamber valve 37. It is therefore possible to rapidly and reliably detect an abnormality relating to the chamber valve 37 or a symptom thereof. Further, since the directly monitoring target is the opening/closing frequency of the chamber valve 37 repeatedly opened and closed at a high speed, in the present embodiment, it is configured such that the DO opening/closing counter 421 and the DI opening/closing counter 423 are provided in each of the I/O boards 415, which is a lower-hierarchy control device for controlling the input and output signals between the module controller 401 and the end devices 201. Thus, it becomes possible to reduce the communications data amount in the module controller 401 and to rapidly detect the trouble in the chamber valve 37.

While the chamber valve 37 has been described above by way of example, the opening/closing operation statuses of the respective chamber valves 47, 57 and 67 can be determined in a similar manner by using the corresponding DO opening/closing counters 421 and the corresponding DI opening/closing counters 423. In case of the ALD process for the TiN film forming process, if the minimum changeover time of the opening/closing operations of the respective chamber valves 37, 47, 57 and 67 is assumed to be 50 ms, the processing time for one cycle ($N_2$ gas purging→$TiCl_4$ gas supply→$N_2$ gas purging→$NH_3$ gas supply) becomes 200 ms. Thus, the DO opening/closing counter 421 and the DI opening/closing counter 423, each of which is the 16-bits counter, can perform the counting operation for 218 minutes (200 ms×$2^{16}$).

In the film forming apparatus 100 of the present embodiment described above, the DO opening/closing counter 421 and the DI opening/closing counter 423, which are involved in the opening and closing operation of each of the chamber valves 37, 47, 57 and 67, are provided in each of the I/O boards 415, which is a lower-hierarchy device compared to the module controller 401. The operation statuses of the chamber valves 37, 47, 57 and 67 opened and closed at a high speed can be rapidly detected by using the count values A of the DO opening/closing counters 421 and the count values B of the DI opening/closing counters 423.

2. Second Embodiment

Next, a film forming apparatus in accordance with a second embodiment of the present invention will be described with reference to FIGS. 6 to 10.

Figure 6:
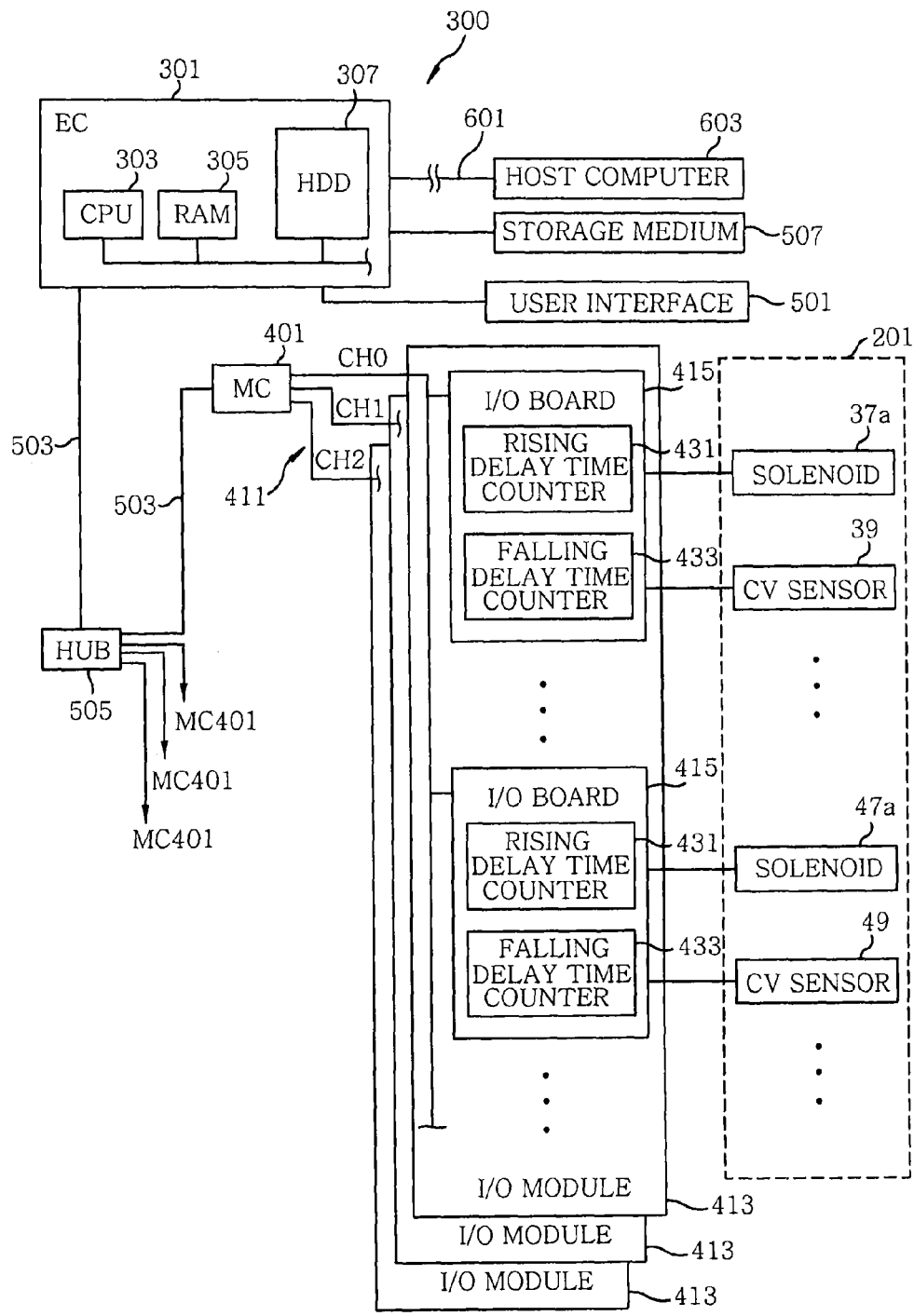
FIG. 6 is an explanatory view showing a schematic configuration of a control system for a substrate processing system including a film forming apparatus in accordance with a second embodiment of the present invention.

In the present embodiment, as shown in FIG. 6, two kinds of counter units for measuring a relative time difference between a feedback DI signal of a drive DO signal including one or more valve opening/closing drive signals for each of the solenoids 37a, 47a, 57a and 67a and a DI signal including one or more valve opening/closing detection signals from each of the CV sensors 39, 49, 59 and 69 are provided in each of the I/O boards 415, which is a lower-hierarchy control device compared to the module controller 401.

The first kind of counter unit is a rising delay time counter 431 for measuring a rising delay time of each of the chamber valves 37, 47, 57 and 67 obtained based on the rising time difference between the two DI signals. The second kind of counter unit is a falling delay time counter 433 for measuring a falling delay time of each of the chamber valves 37, 47, 57 and 67 obtained based on the falling time difference between the two DI signals.

In this regard, the term "rising" means the opening operation of a valve and the term "falling" means the closing operation of a valve. In the film forming apparatus of the present embodiment, the components other than the two kinds of counter units are the same as the components of the film forming apparatus 100 of the first embodiment. Therefore, the following description will be focused on the different points.

Figure 7A:
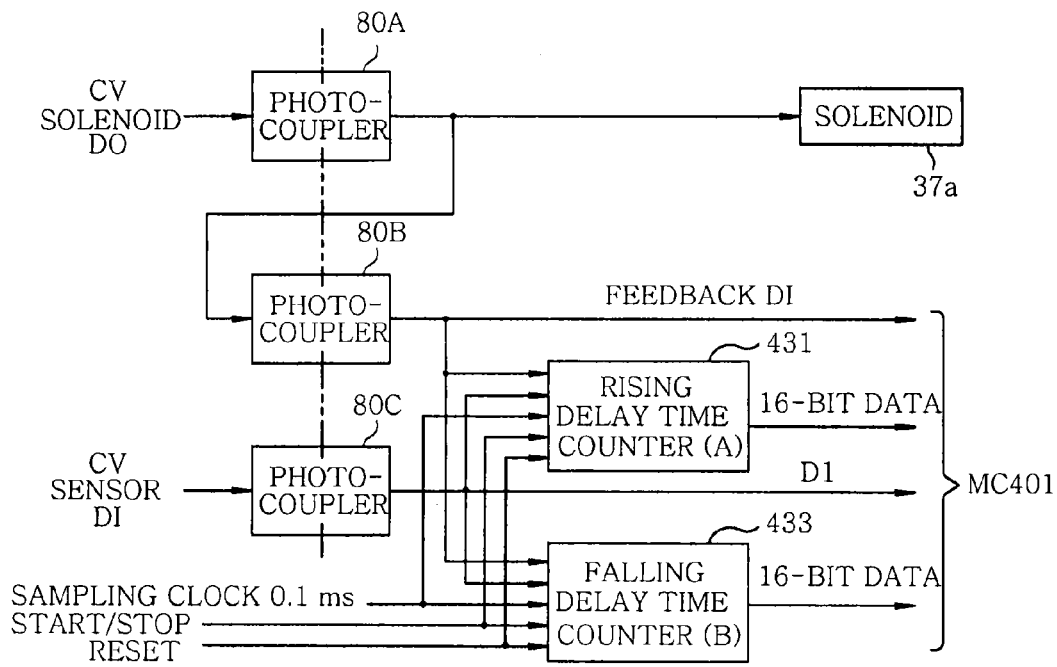
FIG. 7A is an explanatory view partially showing a control system including chamber valve opening/closing delay time counters in accordance with the second embodiment of the present invention.
Figure 7B:
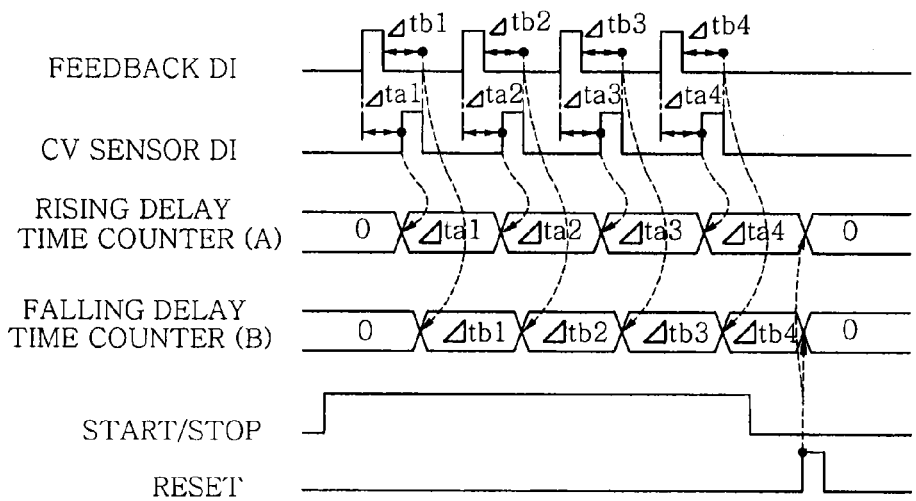
FIG. 7B is a timing chart explaining the principle of counting operation performed by the delay time counters in accordance with the second embodiment of the present invention.

FIG. 7A partially shows a control system for controlling the opening/closing of the chamber valve and a control system for controlling the CV sensor. FIG. 7B is a timing chart explaining the principle of counting operations performed by the rising delay time counter 431 and the falling delay time counter 433. In FIG. 7B, there is also shown the relationship between the opening/closing drive signals for the chamber valve and the opening/closing detection signals detected by the CV sensor. As a representative example, the chamber valve 37 and the CV sensor 39 will be described herein.

In order to drive the chamber valve 37 while the ALD process is performed in the film forming apparatus, the CV solenoid DO signal, which is the digital output information transmitted from the module controller 401, is transferred to the solenoid 37a of the chamber valve 37 through the photo-coupler 80A. Concurrently, the CV solenoid DO signal, which includes the valve opening/closing drive signals, is fed back as digital input information DI, to the module controller 401 through the photo-coupler 80B. The feedback DI signal is also transmitted to the rising delay time counter 431 and the falling delay time counter 433 on the I/O board 415.

Meantime, while the ALD process is performed in the film forming apparatus 100, the CV sensor 39 transmits the CV sensor DI signal, which includes the valve opening/closing detection signals, to the module controller 401 as digital input information DI through the photo-coupler 80C. The CV sensor DI signal is also transmitted to the rising delay time counter 431 and the falling delay time counter 433 on the I/O board 415.

Each of the rising delay time counter 431 and the falling delay time counter 433 counts the time difference between the feedback DI signal and the CV sensor DI signal. More specifically, the rising delay time counter 431 obtains the rising time differences (the delay times) between the valve opening/closing drive signals and the valve opening/closing detection signals. The falling delay time counter 433 obtains the falling time differences (the delay times) between the valve opening/closing drive signals and the valve opening/closing detection signals.

In the timing chart shown in FIG. 7B, a rising edge of a rectangular shape of the feedback DI signal (having the same waveform as the CV solenoid DO signal) denotes a command signal for the opening of the chamber valve 37. The falling edge therein denotes a command signal for the closing of the chamber valve 37. Similarly, the rising edge of the rectangular shape of the CV sensor DI signal denotes a detection signal indicating the physical opening of the chamber valve 37. The falling edge of the rectangular shape thereof denotes a detection signal indicating the physical closing of the chamber valve 37.

In FIG. 7B, the rising delay time measured by the rising delay time counter 431 is indicated by $\Delta ta$ ($\Delta ta1$, $\Delta ta2$, $\Delta ta3$, $\Delta ta4$, etc.). The falling delay time measured by the falling delay time counter 433 is indicated by $\Delta tb$ ($\Delta tb1$, $\Delta tb2$, $\Delta tb3$, $\Delta tb4$, etc.). In FIG. 7B, the corresponding relationship between the rising timing of the CV sensor DI signal measured by the rising delay time counter 431 and the counted rising delay time $\Delta ta$ ($\Delta ta1$, $\Delta ta2$, $\Delta ta3$, $\Delta ta4$, etc.) is indicated by dashed-line arrows. Similarly, in FIG. 7B, the corresponding relationship between the falling timing of the CV sensor DI signal measured by the falling delay time counter 433 and the counted falling delay time $\Delta tb$ ($\Delta tb1$, $\Delta tb2$, $\Delta tb3$, $\Delta tb4$, etc.) is indicated by dashed-line arrows.

Each of the rising and the falling delay time counter 431 and 433 is a 16-bit counter. As shown in FIG. 7B, each of the rising and the falling delay time counter 431 and 433 starts or stops a counting operation in response to a start or stop command transmitted from the module controller 401. The sampling clock of the rising and the falling delay time counter 431 and 433 may be set to, e.g., 0.1 ms. The count values (counted time differences) of the rising and the falling delay time counter 431 and 433 are transmitted to the module controller 401 as 16-bit data.

Additionally, a storage unit may be provided in each of the rising and the falling delay time counter 431 and 433, so that the maximum value and/or the minimum value of each of the delay times $\Delta ta$ and $\Delta tb$ can be obtained and transmitted to the module controller 401. In that case, as shown in FIG. 7B, the rising and the falling delay time counter 431 and 433 start or stop storing the maximum value and/or the minimum value in response to a start or stop command transmitted from the module controller 401 and the maximum value and/or the minimum value is reset to zero in response to a reset command transmitted from the module controller 401. In the film forming apparatus 100 of the present embodiment, the maximum value and/or the minimum value of each of the delay times $\Delta ta$ and $\Delta tb$ may be obtained every time the processing of a single wafer W is completed or every time the processing of a predetermined number of wafers W is completed.

(Determination Method)

The determination on the operation status of the chamber valve 37 by using the rising delay time counter 431 and/or the falling delay time counter 433 can be made by, e.g., measuring in advance the delay times (time differences) $\Delta ta$ and $\Delta tb$ in the normal operation and comparing the delay times (time differences) $\Delta ta$ and $\Delta tb$ measured in the actual operation with those measured in the normal operation.

If the delay times $\Delta ta$ and $\Delta tb$ measured in the actual operation differ significantly from those measured in the normal operation, it can be determined that the chamber valve 37 including the solenoid 37a may be degraded, or it can be determined that the CV sensor 39 may be out of alignment or out of adjustment. In this case, the delay times $\Delta ta$ and $\Delta tb$ measured in the actual operation may be compared with a predetermined delay time threshold. Alternatively, the maximum value and/or the minimum value of each of the delay times $\Delta ta$ and $\Delta tb$ measured in the actual operation may be compared with a predetermined threshold of the maximum value or the minimum value of each delay time.

The aforementioned determination can be made by the software (recipe) of the module controller 401. In a case where the trouble of the chamber valve 37 is detected, the module controller 401 transmits a control signal to stop, e.g., the ALD process in the film forming apparatus 100. The count value (counted time difference) can be read even during the counting operation, and thus it is possible to monitor the operation status of the chamber valve 37 on a real time basis. The rising delay time counter 431 and the falling delay time counter 433, each of which is the 16-bits counter, can count the delay times $\Delta ta$ and $\Delta tb$ of up to 6.5 seconds ($0.1 \text{ ms} \times 2^{16}$), respectively.

Figure 8:
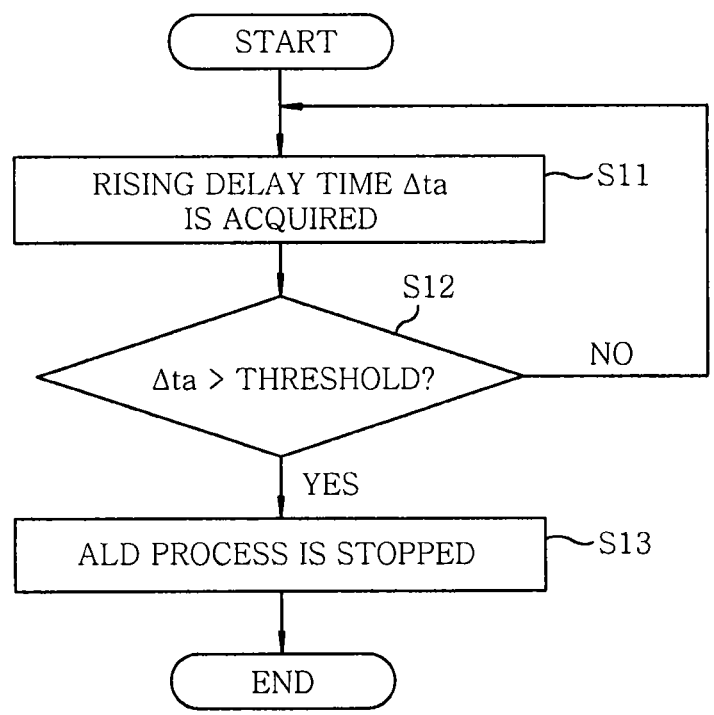
FIG. 8 is an example of a sequence of a valve operation checking method in accordance with the second embodiment of the present invention.

FIG. 8 shows an example of a sequence of the determination method on the operation status of the chamber valve 37 in the present embodiment. The sequence shown in FIG. 8 describes, as an example, a case where a delay time measured by the rising delay time counter 431 is compared with a predetermined threshold. However, the determination can be made in a similar manner by using a delay time measured by the falling delay time counter 433. Further, the determination can be made based on the delay times measured by both of the rising and the falling delay time counter 431 and 433.

First, in FIG. 8, the module controller 401 acquires a delay time $\Delta ta$ measured by the rising delay time counter 431 (step S11). Next, the module controller 401 determines whether or not the delay time $\Delta ta$ exceeds a predetermined threshold (step S12). The comparison between the delay time $\Delta ta$ and the predetermined threshold in step S12 is carried out by the module controller 401 serving as a determination unit. Further, the predetermined threshold used in step 12 may be set based on a delay time $\Delta ta$ measured in the normal operation. For example, the predetermined threshold may be set based on the maximum value of the delay time $\Delta ta$ measured in the normal operation. Such predetermined threshold may be the one that stored in the nonvolatile memory unit 407 in the module controller 401.

If it is determined that the delay time Δta exceeds the predetermined threshold (YES in step S12), the module controller 401 transmits a control signal to, e.g., stop an ALD process in step S13. Further, in step S13, another process such as a display of a warning notification on the display unit of the user interface 501 or the like may be carried out without immediately stopping the ALD process.

On the other hand, if it is determined that the delay time Δta does not exceeds the predetermined threshold (NO in step S12), the process returns back to step S11. Then, the sequence shown in FIG. 8 is repeated, e.g., until a film forming process for a single wafer W is completed or until it is determined that the delay time Δta exceeds the predetermined threshold (YES in step S12).

As described above, the monitoring target is the delay time of the opening/closing operation of the chamber valve 37 in the film forming apparatus of the present embodiment. Accordingly, it is possible to detect the symptom of failure of the chamber valve 37 before the chamber valve 37 becomes inoperable due to the failure thereof. Further, since the monitoring target is the delay time of the opening/closing operation of the chamber valve 37 repeatedly opened and closed at a high speed, each of the I/O boards 415 in the present embodiment, which is a lower-hierarchy control device for controlling the input and output signals between the module controller 401 and the end devices 201, is configured to include the rising and the falling delay time counter 431 and counter 433. Thus, it becomes possible to reduce the communications data amount in the module controller 401 and to accurately obtain the delay time of the opening/closing operation of the chamber valve 37.

While the chamber valve 37 has been described above by way of example, the opening/closing operation statuses of the respective chamber valves 47, 57 and 67 can be determined in a similar manner by using the rising delay time counter 431 and/or the falling delay time counter 433.

With the present embodiment, the operation status of each of the chamber valves 37, 47, 57 and 67 can be detected based on the delay time Δta measured by the rising delay time counter 431 and/or the delay time Δtb measured by the falling delay time counter 433. By using the delay times Δta and Δtb, it becomes possible to detect the symptom of an abnormality (the degradation of components) that cannot be detected when the monitoring target is the opening/closing frequency of each of the chamber valves 37, 47, 57 and 67. It is therefore possible to avoid in advance the occurrence of a trouble in each of the chamber valves 37, 47, 57 and 67.

Other configurations and effects of the film forming apparatus of the present embodiment remain the same as those of the film forming apparatus of the first embodiment.

<Modification>

Figure 9:
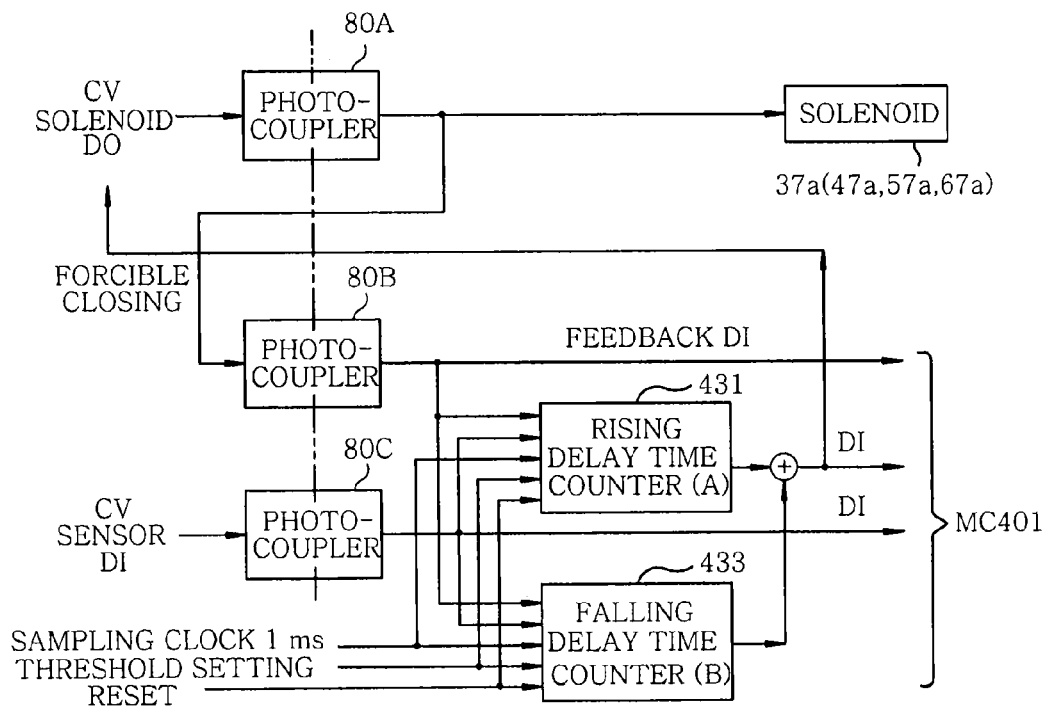
FIG. 9 is an explanatory view partially showing a control system for performing a chamber valve forcible closing operation in accordance with a modification of the second embodiment of the present invention.
Figure 10:
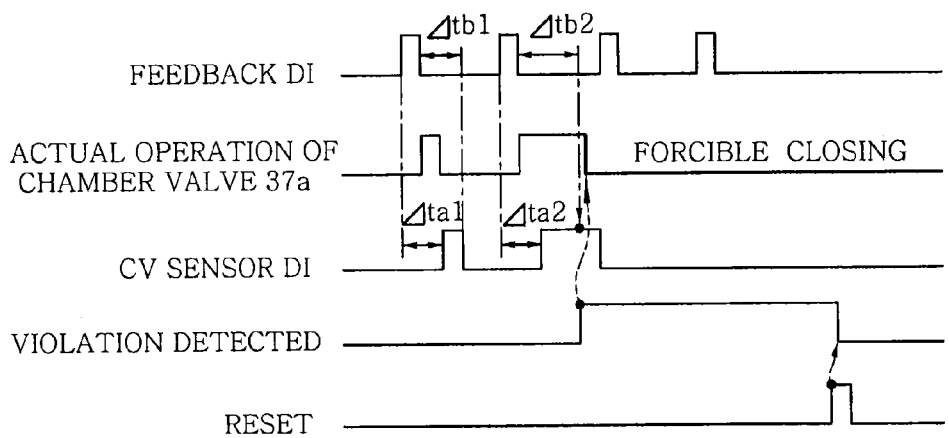
FIG. 10 is a timing chart explaining the chamber valve forcible closing operation in accordance with the modification of the second embodiment of the present invention.

Next, a modification of the second embodiment will be described with reference to FIGS. 9 and 10. In the present modification, if one of the rising delay time Δta measured by the rising delay time counter 431 and/or the falling delay time Δtb measured by the falling delay time counter 433 exceeds a predetermined threshold, one or more chamber valves are controlled to be forcibly closed. FIG. 9 partially shows a chamber valve opening/closing control system and a CV sensor control system. FIG. 10 is a timing chart illustrating the principle of the counting operations performed by the rising delay time counter 431 and/or the falling delay time counter 433. In FIG. 10, there is also illustrated the corresponding relationship between the opening/closing drive signals for the chamber valve and the opening/closing detection signals detected by the CV sensor. As a representative example, the chamber valve 37 and the CV sensor 39 will be described herein.

Each of the rising delay time counter 431 and/or the falling delay time counter 433 shown in FIG. 9 is, e.g., a 8-bit counter. The rising delay time counter 431 and the falling delay time counter 433 measure the respective delay times Δta and Δtb on a unit of 1 ms. The 8-bit counter can measure the delay times Δta and Δtb of up to 256 ms (=1 ms×$2^8$).

In the present modification, the delay time Δta and/or the delay time Δtb (that is, time differences between the valve opening/closing drive signals and the valve opening/closing detection signals corresponding thereto), which are being counted respectively by the rising delay time counter 431 and the falling delay time counter 433, are compared with a predetermined delay time threshold. If one of the delay times Δta and Δtb of the chamber valve 37 exceeds the threshold during the counting operation, the chamber valves 47 and 57 contributing to the process are forcibly closed (forcible closing). In FIG. 10, there is shown a case where the delay time Δtb2 exceeds the threshold. Alternatively, the maximum value and/or the minimum value of each of the delay time Δta and/or the delay time Δtb, which are being counted respectively by the rising delay time counter 431 and the falling delay time counter 433, may be compared with a predetermined delay time threshold. The threshold can be acquired by using the analog output information AO provided from the software (recipe) of the module controller 401. If the threshold is set to zero (nothing), the forcible closing operation is not performed.

As shown in FIG. 9, the forcible closing operation is performed in such a way that the rising delay time counter 431 or the falling delay time counter 433 generates a CV solenoid DO signal indicative of the forcible closing operation and transmits the CV solenoid DO signal to the solenoids 47a and 57a at the same time. As a consequence, the chamber valves 47 and 57 are closed. The forcible closing operation of the chamber valves 47 and 57 is notified to the module controller 401 as digital input information DI. The forcible closing operation of the chamber valves 47 and 57 and the notification of the digital input information DI to the module controller 401 are maintained until a reset operation is performed by the digital output information DO provided from the software (recipe) of the module controller 401.

In the present modification, each of the I/O boards 415 has a function of forcibly closing one or more of the chamber valves 37, 47, 57 and 67. Thus, the ALD process is immediately stopped if a trouble is generated in any one of the chamber valves 37, 47, 57 and 67. This makes it possible to minimize a decline in the production yield.

While the chamber valve 37 has been described above by way of example, the forcible closing operation can be performed in case of each of the chamber valves 47, 57 and in a similar manner by using the rising delay time counter 431 and/or the falling delay time counter 433.

3. Third Embodiment

Next, a film forming apparatus in accordance with a third embodiment of the present invention will be described with reference to FIGS. 11 to 13. The film forming apparatus of the present embodiment includes a counter unit for detecting and counting the simultaneous opening state of two or more chamber valves.

Figure 11:
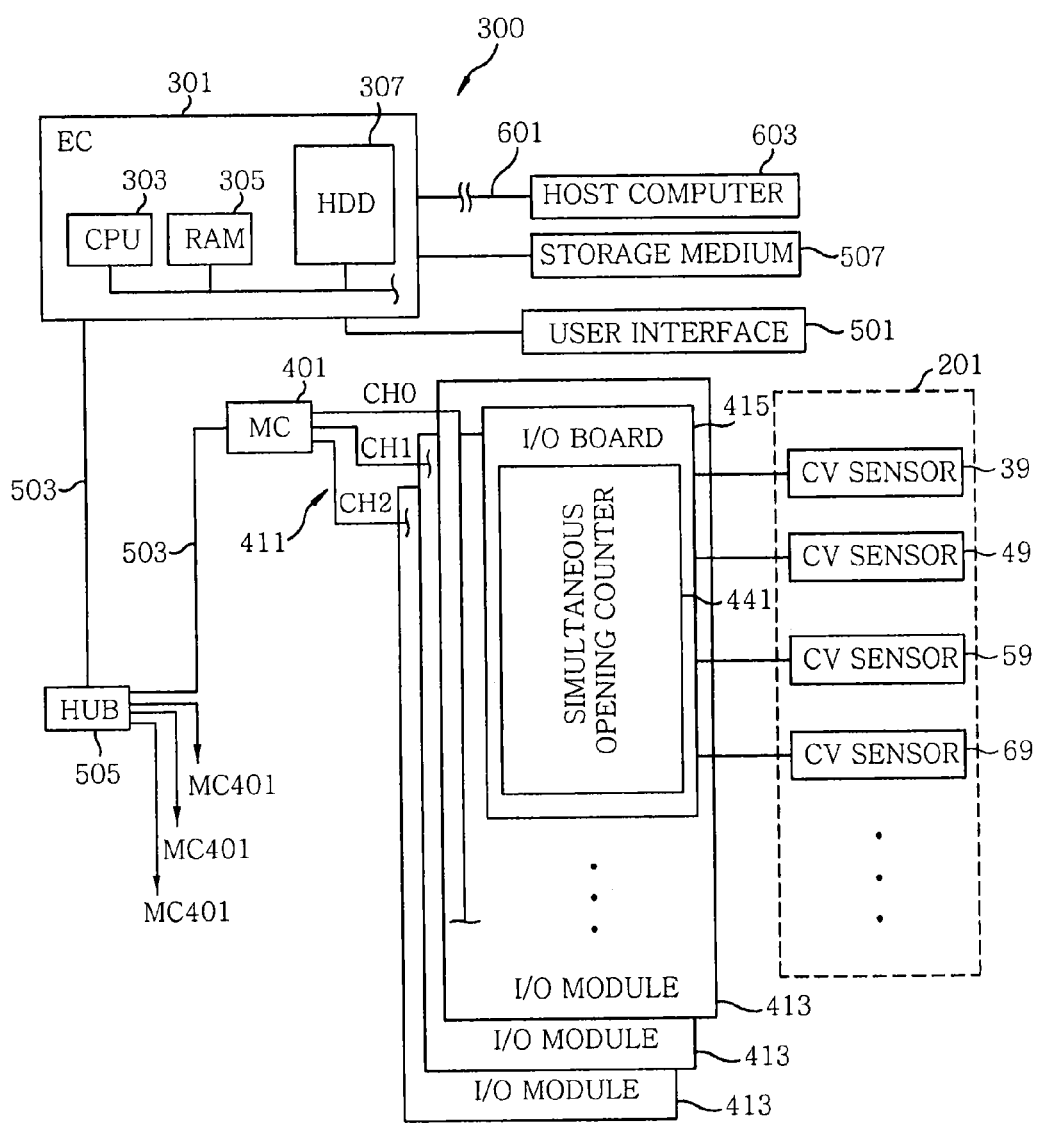
FIG. 11 is an explanatory view showing a schematic configuration of a control system for a substrate processing system including a film forming apparatus in accordance with a third embodiment of the present invention.

More specifically, as shown in FIG. 11, the I/O board 415, which is a lower-hierarchy control device compared to the module controller 401, is configured to include a simultaneous opening counter 441 for detecting and counting the simultaneous opening state of two or more of the chamber valves 37, 47, 57 and 67 by using each of the CV sensor DI signals transmitted from the CV sensors 39, 49, 59 and 69.

In the film forming apparatus of the present embodiment, the components other than the counter unit are the same as those of the film forming apparatus 100 of the first embodiment. The following description will be focused on the different points.

In the ALD process, a plurality of cycles each including a series of steps is repeatedly performed. It is therefore necessary to alternately open and close the respective chamber valves 37, 47, 57 and 67. However, if the chamber valves 47 and 57 are opened at the same time, a $TiCl_4$ gas and an $NH_3$ gas are simultaneously supplied into the processing chamber 1, whereby such process becomes a typical CVD process instead of the ALD process.

In order to prevent frequent occurrence of such trouble, the I/O board 415 in the film forming apparatus of the present embodiment includes a simultaneous opening counter 441 as shown in FIG. 11. The simultaneous opening counter 441 acquires a detection signal indicative of the opening/closing of each of the chamber valves 37, 47, 57 and 67 from the CV sensors 39, 49, 59 and 69, thereby detecting and counting the simultaneous opening state of two or more of the chamber valves 37, 47, 57 and 67 which is not preferable if they are simultaneously opened during the time in the process.

Figure 12:
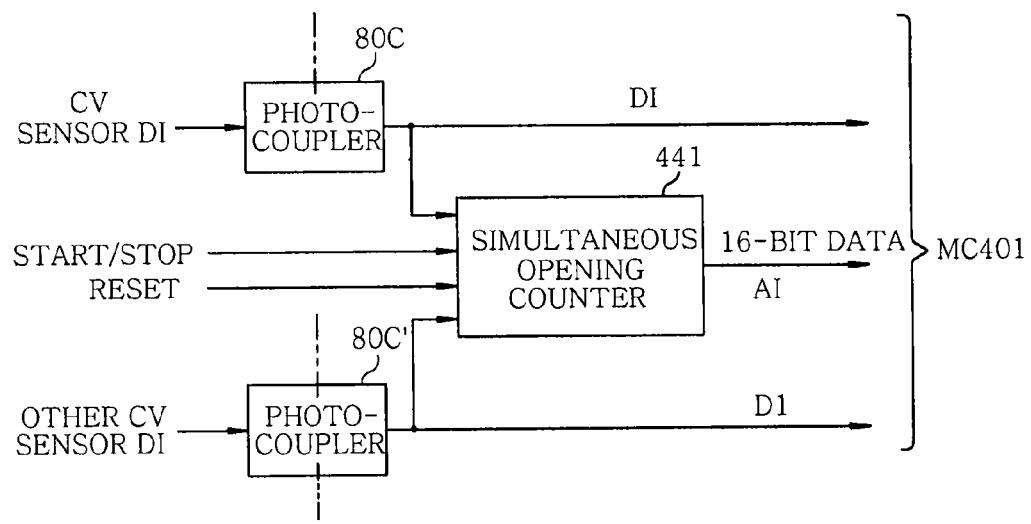
FIG. 12 is an explanatory view partially showing a control system including a chamber valve simultaneous opening counter in accordance with the third embodiment of the present invention.

FIG. 12 partially shows a control system of a CV sensor including the simultaneous opening counter 441. The detection signals indicating the opening/closing of the respective chamber valves 37, 47, 57 and 67 are transmitted from the corresponding CV sensors 39, 49, 59 and 69 to the module controller 401 as CV sensor DI signals.

For example, the detection signal indicative of the opening/closing of an arbitrary chamber valve (e.g., the chamber valve 37) is transmitted as a CV sensor DI signal to the module controller 401 through the photo-coupler 80C. Similarly, the detection signals indicative of the opening/closing of the chamber valves 47, 57 and 67 detected by other CV sensors 49, 59 and 69 are transmitted as CV sensor DI signals (generally referred to as "other CV sensor DI" in FIG. 12) to the module controller 401 through the photo-coupler 80C'. At this time, the CV sensor DI signals transmitted from the respective CV sensors 39, 49, 59 and 69 are also transmitted to the simultaneous opening counter 441 of the I/O board 415. The simultaneous opening counter 441 can detect the simultaneous opening of two or more of the chamber valves 37, 47, 57 and 67 through a comparison and reference process. In case where two or more of the chamber valves 37, 47, 57 and 67 are opened at the same time, the simultaneous opening counter 441 counts the number of occurrences of the simultaneous opening.

It is not necessary for the simultaneous opening counter 441 to monitor the simultaneous opening of all combinations of the chamber valves 37, 47, 57 and 67. For example, two or more arbitrary valves, e.g., the chamber valves 47 and 57, may be selected to be monitored the simultaneous opening thereof.

The simultaneous opening counter 441 is, e.g., a 4-bit counter, and is configured to count the values ranging from 0 to 15. As shown in FIG. 12, the monitoring of the simultaneous opening performed by the simultaneous opening counter 441 is started and stopped based on a start/stop command transmitted from the module controller 401 and is reset in response to a reset command transmitted from the module controller 401.

The monitoring result of the simultaneous opening of the chamber valves 37, 47, 57 and 67 obtained by the simultaneous opening counter 441 is transmitted as a 16-bit AI signal to the module controller 401, which is a higher-hierarchy control device. The simultaneous opening counter 441 may generate an AI signal of a count value with respect to each of the chamber valves 37, 47, 57 and 67. Alternatively, the simultaneous opening counter 441 may divide the count values of the chamber valves 37, 47, 57 and 67 on an arbitrary bit basis and may transmit a single AI signal to the module controller 401. The module controller 401 can refer to the count values of the simultaneous opening counter 441 at all times.

In the film forming apparatus of the present embodiment, the simultaneous opening counter 441 can start or stop the counting operation in conformity with the start or end of the processing of a single wafer W and can continuously perform the counting operation while a predetermined number of wafers W is processed. Alternatively, the simultaneous opening counter 441 can start or stop the counting operation on an ALD cycle unit or an ALD step unit while a single wafer W is processed. In this case, it is possible to detect an abnormality while a single wafer W is processed.

(Determination)

The software (recipe) of the module controller 401 can be used to make determination based on the monitoring result of the simultaneous opening of the chamber valves 37, 47, 57 and 67, which is obtained by the simultaneous opening counter 441. In this case, if the read-out count value (the number of occurrences of the simultaneous opening) is not equal to 0(zero), it is determined that an "abnormality" has occurred. In case where, the abnormality, i.e., the simultaneous opening of two or more of the chamber valves 37, 47, 57 and 67, is detected, for example, a notification of such abnormality may be displayed on the display of the user interface 501, or the module controller 401 may transmit a control signal to the end devices 201 to the stop the ALD process in the film forming apparatus 100.

Further, the determination based on the monitoring result of the simultaneous opening of the chamber valves 37, 47, 57 and 67, can be performed by comparing the count value obtained by the simultaneous opening counter 441 with a threshold set based on a simultaneous opening count value, which has substantially no effect on the process result, obtained in advance by an experiment. In this case, the threshold used in the determination may be set differently depending on the combination of the gases whose supply is controlled by the chamber valves 37, 47, 57 and 67. In the present embodiment described above, the simultaneous opening counter 441 is provided in the I/O board 415. It is therefore possible to detect the unexpected simultaneous opening of two or more of the chamber valves 37, 47, 57 and 67.

Figure 13:
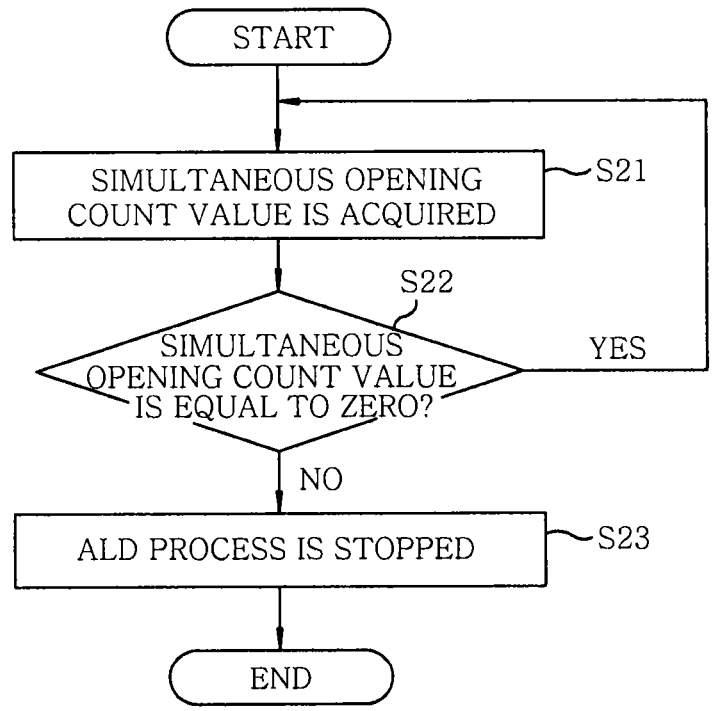
FIG. 13 is an example of a sequence of a valve operation checking method in accordance with the third embodiment of the present invention.

FIG. 13 shows an example of a sequence of the determination method on the operation status of the chamber valve 37 in the present embodiment. First, in FIG. 13, the module controller 401 acquires the simultaneous opening count value (the number of occurrences of the simultaneous opening) obtained by the simultaneous opening counter 441 (step S21). Next, the module controller 401 determines whether or not the simultaneous opening count value is equal to 0 (zero) (step S22). It is determined that the simultaneous opening count value is not equal to 0 (NO in step S22) if the simultaneous opening of two or more of the chamber valves 37, 47, 57 and 67 occurs at least one time. Such determination in step S22 is carried out by the module controller 401 serving as a determination unit.

If it is determined in step S22 that the simultaneous opening count value is not equal to 0, the module controller 401 transmits a control signal to, e.g., stop an ALD process in the next step S23. Further, in step S23, another process such as a display of a warning notification on the display unit of the user interface 501 or the like may be carried out without immediately stopping the ALD process.

On the other hand, if it is determined that the simultaneous opening count value is equal to 0 (YES in step S22), the process returns back to step S11. Then, the sequence shown in FIG. 13 is repeated, e.g., until a film forming process for a single wafer W is completed or until It is determined that the simultaneous opening count value is not equal to 0 (NO in step S22).

Other configurations and effects of the film forming apparatus of the present embodiment remain the same as those of the film forming apparatus of the first embodiment.

4. Fourth Embodiment

Next, a film forming apparatus in accordance with a fourth embodiment of the present invention will be described with reference to FIGS. 14 to 17.

Figure 14:
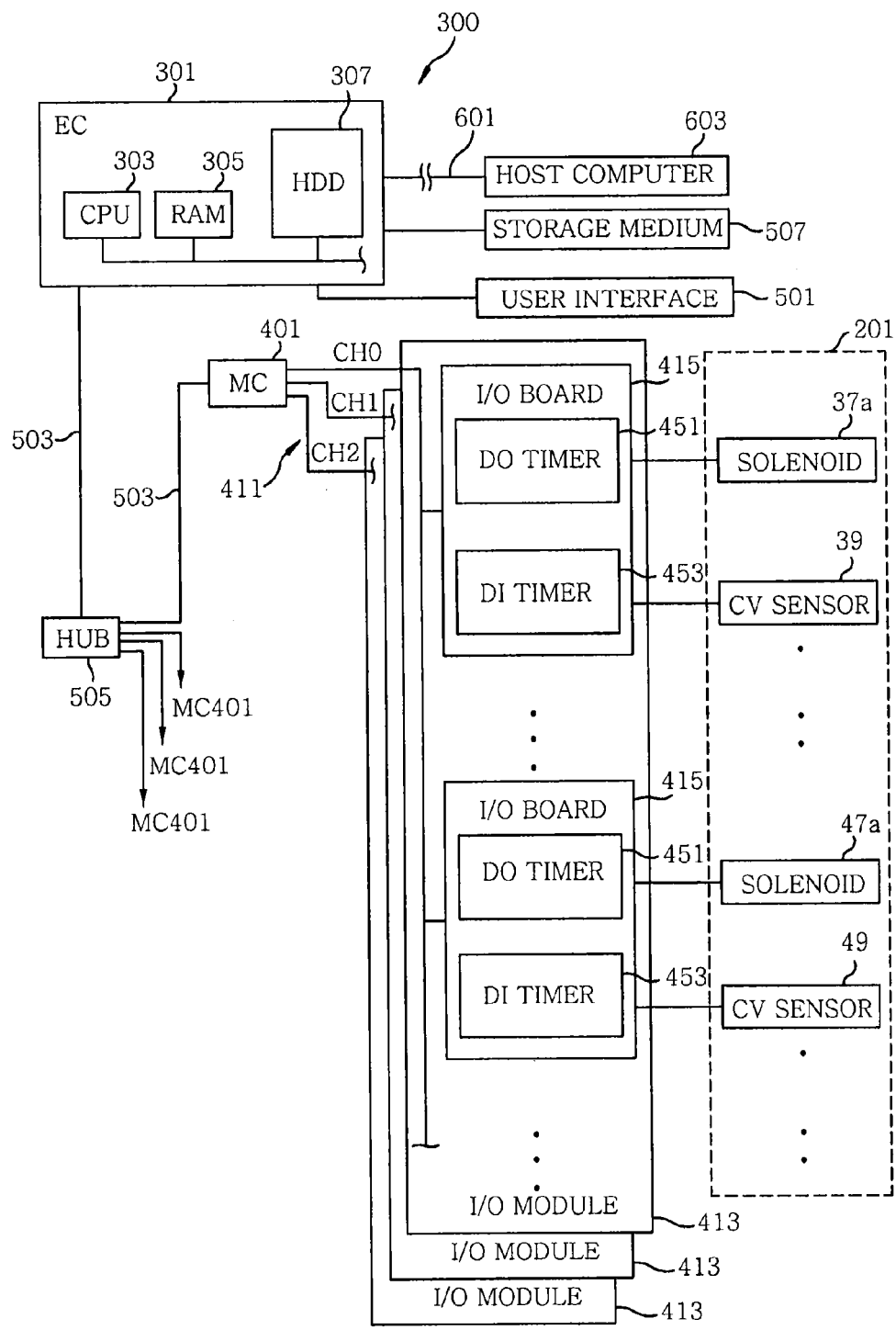
FIG. 14 is an explanatory view showing a schematic configuration of a control system for a substrate processing system including a film forming apparatus in accordance with a fourth embodiment of the present invention.

In the present embodiment, as shown in FIG. 14, two kinds of timer units are arranged in the I/O boards 415, which are a lower-hierarchy control device compared to the module controller 401.

The first kind of timer unit is a DO timer 451 for measuring a time period for each of valve opening/closing drive signals included in a feedback DI signal of a drive DO signal of each of the solenoids 37a, 47a, 57a and 67a. The second kind of timer unit is a DI timer 453 for measuring a time period for each of valve opening/closing detection signals included in a DI signal from each of the CV sensors 39, 49, 59 and 69. In the film forming apparatus of the present embodiment, the components other than the two kinds of timer units are the same as the components of the film forming apparatus 100 of the first embodiment. Therefore, the following description will be focused on the different points.

Figure 15A:
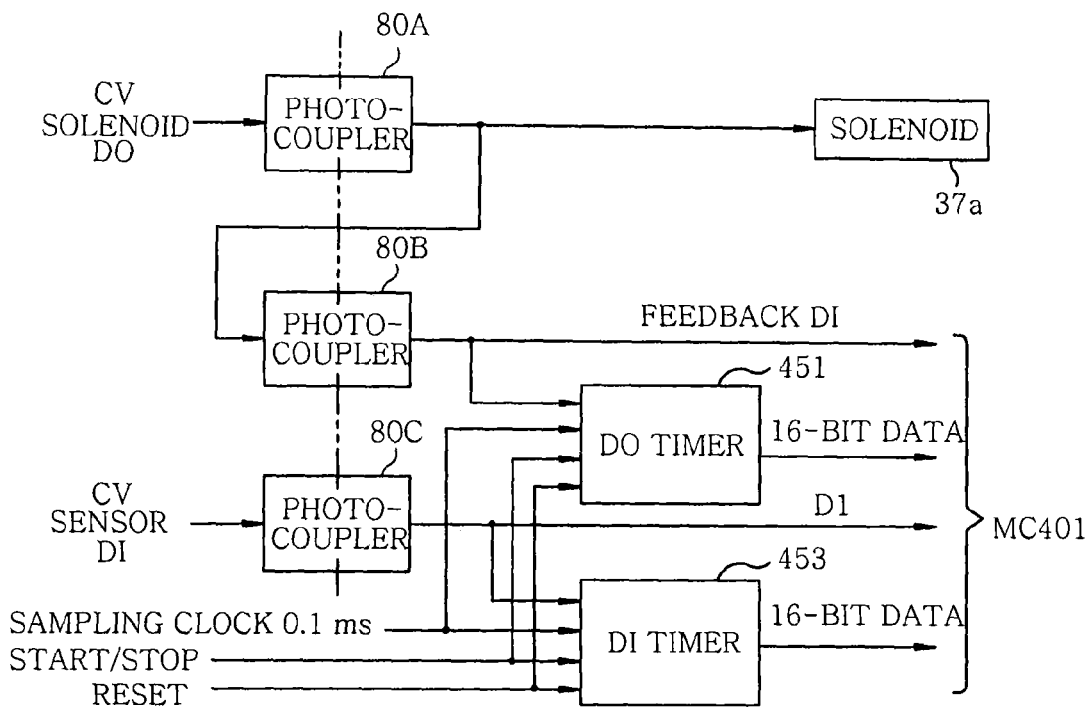
FIG. 15A is an explanatory view partially showing a control system including chamber valve opening time period timers in accordance with the fourth embodiment of the present invention.
Figure 15B:
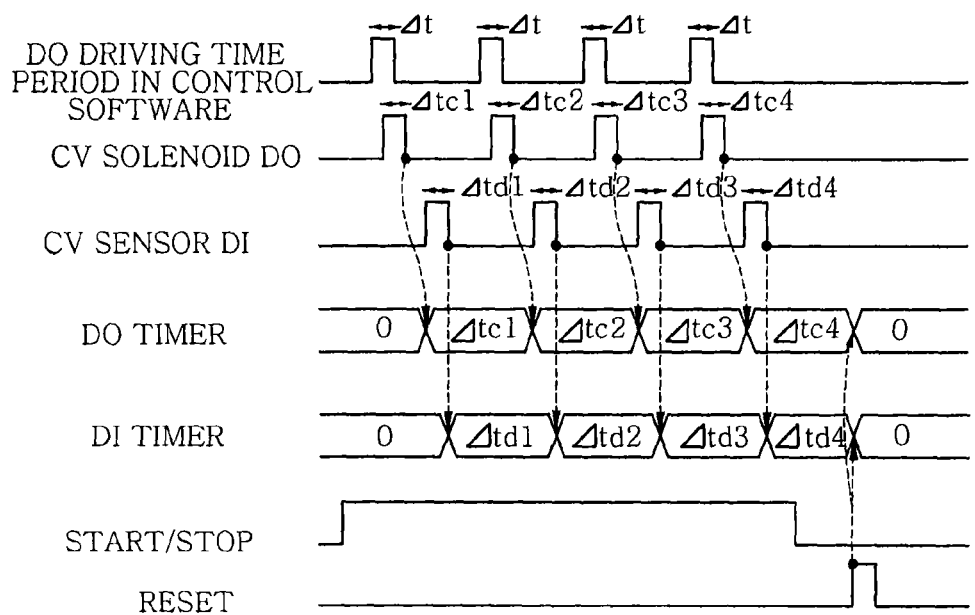
FIG. 15B is a timing chart explaining the principle of measuring operations performed by the opening time period timers in accordance with the fourth embodiment of the present invention.

FIG. 15A partially shows a control system for controlling the opening/closing of the chamber valve and a control system for controlling the CV sensor. FIG. 15B is a timing chart explaining the principle of time period measuring operations performed by the DO timer 451 and the DI timer 453. In FIG. 15B, there is also shown the relationship between the opening/closing drive signals for the chamber valve and the opening/closing detection signals detected by the CV sensor. As a representative example, the chamber valve 37 and the CV sensor 39 will be described herein.

In order to drive the chamber valve 37 while the ALD process is performed in the film forming apparatus, the CV solenoid DO signal, which is the digital output information transmitted from the module controller 401, is transferred to the solenoid 37a of the chamber valve 37 through the photo-coupler 80A. Concurrently, the CV solenoid DO signal, which includes the valve opening/closing drive signals, is fed back as digital input information DI, to the module controller 401 through the photo-coupler 80B. The feedback DI signal is also transmitted to the DO timer 451 on the I/O board 415, and the time period for each of the valve opening/closing drive signals included in the feedback DI signal is measured.

Meantime, while the ALD process is performed in the film forming apparatus 100, the CV sensor 39 transmits the CV sensor DI signal, which includes the valve opening/closing detection signals, to the module controller 401 as digital input information DI through the photo-coupler 80C. The CV sensor DI signal is also transmitted to the DI timer 453 on the I/O board 415, and the time period for each of the valve opening/closing detection signals included in the CV sensor DI signal is measured.

In the timing chart shown in FIG. 15B, a DO driving time period set by a software for controlling the driving of the chamber valve 37 is indicated by $\Delta t$. The DO driving time period $\Delta t$ set by this software corresponds to an opening time period of the chamber valve 37 set by the software. Further, in FIG. 15B, a rising edge of a rectangular shape of each valve opening/closing drive signal in the CV solenoid DO signal (having the same waveform as the feedback DI signal) denotes a command signal for the opening of the chamber valve 37. The falling edge of the rectangular shape of each valve opening/closing drive signal in the CV solenoid DO signal denotes a command signal for the closing of the chamber valve 37. Therefore, a time period from the rising edge to the falling edge of the rectangular shape in the CV solenoid DO signal corresponds to a time period (a commanded opening time period) for which the chamber valve 37 is opened by a command of the module controller 401 in accordance with the recipe. In FIG. 15B, the commanded opening time period from the rising edge to the falling edge of each rectangular shape in the CV solenoid DO signal is indicated by $\Delta tc$ ($\Delta tc1$, $\Delta tc2$, $\Delta tc3$, $\Delta tc4$, etc.).

Similarly, the rising edge of the rectangular shape of each valve opening/closing detection signal in the CV sensor DI signal denotes a detection signal indicating the physical opening of the chamber valve 37. The falling edge of the rectangular shape of each valve opening/closing detection signal in the CV sensor DI denotes a detection signal indicating the physical closing of the chamber valve 37. Therefore, a time period from the rising edge to the falling edge of the rectangular shape in the CV sensor DI corresponds to a time period (a detected opening time period) for which the chamber valve 37 is opened. In FIG. 15B, the detected opening time period from the rising edge to the falling edge of each rectangular shape in the CV sensor DI is indicated by $\Delta td$ ($\Delta td1$, $\Delta td2$, $\Delta td3$, $\Delta td4$, etc.)

In FIG. 15B, the corresponding relationship between a falling timing in the CV solenoid DO signal and a starting point of the commanded opening time period $\Delta tc$ ($\Delta tc1$, $\Delta tc2$, $\Delta tc3$, $\Delta tc4$, etc.) measured by the DO timer 451 is indicated by dashed-line arrows. Similarly, in FIG. 15B, the corresponding relationship between a falling timing in the CV sensor DI signal and a starting point of the detected opening time period $\Delta td$ ($\Delta td1$, $\Delta td2$, $\Delta td3$, $\Delta td4$, etc.) measured by the DI timer 453 is indicated by dashed-line arrows.

Each of the DO timer 451 and the DI timer 453 is a 16-bit counter. As shown in FIG. 15B, each of the DO timer 451 and the DI timer 453 starts or stops the time period measuring operation in response to a start or stop command transmitted from the module controller 401. The sampling clock of the DO timer 451 and the DI timer 453 may be set to, e.g., 0.1 ms. The measured time periods of the DO timer 451 and the DI timer 453 are transmitted to the module controller 401 as 16-bit data.

Additionally, a storage unit may be provided in each of the DO timer 451 and the DI timer 453, so that the maximum value and/or the minimum value of each of the commanded opening time period $\Delta tc$ and the detected opening time period $\Delta td$ can be obtained and transmitted to the module controller 401. In that case, as shown in FIG. 15B, the DO timer 451 and the DI timer 453 start or stop storing the maximum value and/or the minimum value in response to a start or stop command transmitted from the module controller 401 and the maximum value and/or the minimum value is reset to zero in response to a reset command transmitted from the module controller 401.

In the film forming apparatus 100 of the present embodiment, the maximum value and/or the minimum value of each of the commanded opening time period Δtc and the detected opening time period Δtd may be obtained every time the processing of a single wafer W is completed or every time the processing of a predetermined number of wafers W is completed. Further, since the normality/abnormality is effectively determined in a state where the opening/closing operation of the chamber valve 37 is performed at a constant interval, it is preferable that, in the ALD process, the commanded opening time period Δtc and/or the detected opening time period Δtd are measured in a particular process in which the opening/closing operation is repeated at a constant time interval.

(Determination Method)

The determination on the operation status of the chamber valve 37 by using the DO timer 451 and/or the DI timer 453 can be made by, e.g., measuring in advance the commanded opening time period Δtc and/or the detected opening time period Δtd in the normal operation and comparing the commanded opening time period Δtc and/or the detected opening time period Δtd measured in the actual operation with those measured in the normal operation.

If the commanded opening time period Δtc and/or the detected opening time period Δtd measured in the actual operation differ significantly from those measured in the normal operation, it can be determined that the software for controlling the operation of the chamber valve 37 may be imperfect; a task priority of the software may be wrong; the chamber valve 37 including the solenoid 37a may be degraded; or the CV sensor 39 may be out of alignment or out of adjustment. In this case, the commanded opening time period Δtc and/or the detected opening time period Δtd measured in the actual operation may be compared with a predetermined threshold. Alternatively, the maximum value and/or the minimum value of the commanded opening time period Δtc and/or the detected opening time period Δtd measured in the actual operation may be compared with a predetermined threshold of the maximum value or the minimum value.

Further, the determination on the operation status of the chamber valve 37 by using the DO timer 451 and/or the DI timer 453 can also be made by, e.g., using two or more of the DO driving time period Δt set by the software, the commanded opening time period Δtc and the detected opening time period Δtd. For example, if the DO driving time period Δt significantly differs from the commanded opening time period Δtc, there may be a problem of (1) a degree of time accuracy in the control software, (2) a signal delay in the I/O board 415 and so on. If the commanded opening time period Δtc significantly differs from the detected opening time period Δtd, there may be a problem of (3) a delay of a mechanical cooperation between the solenoid 37a and the chamber valve 37, (4) the misalignment of the CV sensor 39 and so on.

In case of comparing the DO driving time period Δt with the commanded opening time period Δtc or in case of comparing the commanded opening time period Δtc with the detected opening time period Δtd, the difference therebetween may be compared with a predetermined threshold.

The aforementioned determination can be made by the software (recipe) of the module controller 401. In a case where the problem in the software or the trouble of the chamber valve 37 is detected, the module controller 401 transmits a control signal to stop the ALD process in the film forming apparatus 100 for example. The module controller 401 can read out the commanded opening time period Δtc measured by the DO timer 451 and the detected opening time period Δtd measured by the DI timer 453 even during measuring operation of the timers, and thus it is possible to monitor the operation status of the chamber valve 37 on a real time basis. The DO timer 451 and the DI timer 453, each of which is the 16-bits counter, can measure the commanded opening time period Δtc and the detected opening time period Δtd of up to 6.5 seconds ($0.1 \text{ ms} \times 2^{16}$), respectively.

Figure 16A:
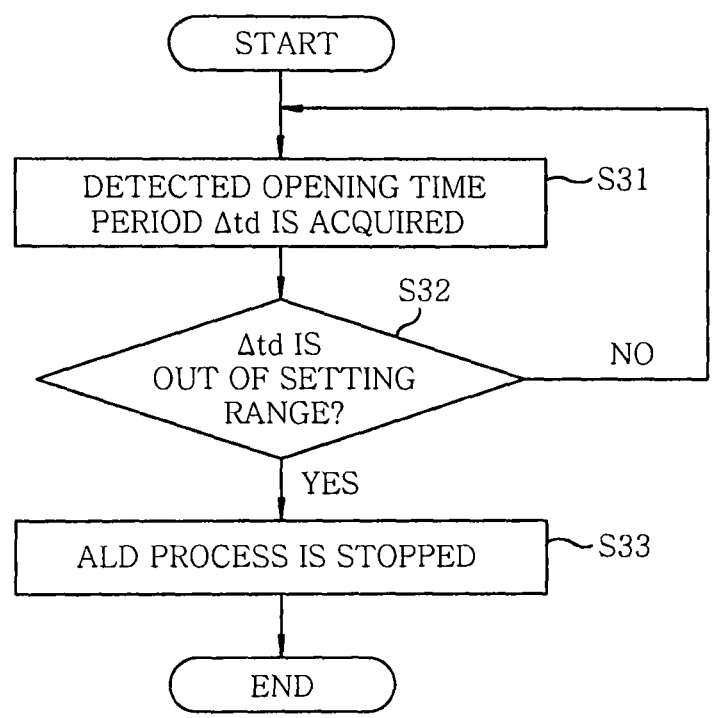
FIG. 16A is an example of a sequence of a valve operation checking method in accordance with the fourth embodiment of the present invention.
Figure 16B:
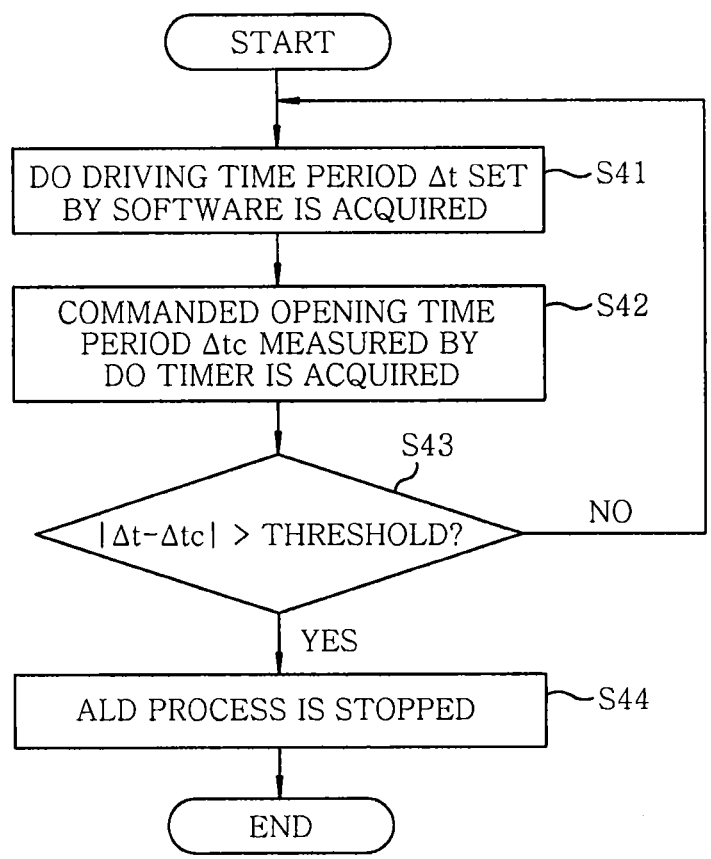
FIG. 16B is another example of a sequence of a valve operation checking method in accordance with the fourth embodiment of the present invention.

FIGS. 16A and 16B show examples of sequences of the determination method on the operation status of the chamber valve 37 in the present embodiment.

In FIG. 16A, first, the module controller 401 acquires a detected opening time period Δtd measured by the DI timer 453 (step S31). Next, the module controller 401 determines whether or not the detected opening time period Δtd is out of a predetermined setting range (step S32). The comparison between the detected opening time period Δtd and the predetermined setting range in step S32 is carried out by the module controller 401 serving as a determination unit. Further, the predetermined setting range used in step 32 may be set based on a variation of the detected opening time period Δtd measured in the normal operation. For example, the predetermined setting range may be set based on the maximum and the minimum value of the detected opening time period Δtd measured in the normal operation. Such predetermined setting range may be the one that stored in the nonvolatile memory unit 407 in the module controller 401.

If it is determined that the detected opening time period Δtd is out of the predetermined setting range (YES in step S32), the opening time period of the chamber valve 37 is not constant (that is, the opening time period becomes too long or too short), which leads to an undesirable effect on the film forming process performed on the film forming apparatus 100. Thus, if it is determined in step S32 that the detected opening time period Δtd is out of the predetermined setting range, the module controller 401 may transmits a control signal to, e.g., stop an ALD process in the next step S33. Further, in step S33, another process such as a display of a warning notification on the display unit of the user interface 501 or the like may be carried out without immediately stopping the ALD process.

On the other hand, if it is determined that the detected opening time period Δtd is in the predetermined setting range (NO in step S32), the process returns back to step S31. Then, the sequence shown in FIG. 16A is repeated, e.g., until a film forming process for a single wafer W is completed or until it is determined that the detected opening time period Δtd is out of the predetermined setting range (YES in step S32).

The sequence shown in FIG. 16A describes, as an example, a case where the detected opening time period Δtd measured by the DI timer 453 is compared with the predetermined setting range (including the predetermined maximum and minimum thresholds). However, the determination can be made in a similar manner by using the commanded opening time period Δtc measured by the DO timer 451. Further, the determination can be made by measuring the commanded opening time period Δtc and the detected opening time period Δtd, and by comparing the commanded opening time period Δtc with the detected opening time period Δtd.

Next, with reference to FIG. 16B, there is described an example of the sequence of the determination method on the operation status of the chamber valve 37 by using, as indicators, the DO driving time period Δt and the commanded opening time period Δtc.

First, the module controller 401 acquires the DO driving time period Δt set by the software (step S41). Next, the module controller 401 acquires the commanded opening time period Δtc measured by the DO timer 451 (step S42). Then, in step S43, the module controller 401 calculates the difference between the DO driving time period Δt and the commanded opening time period Δtc, and it is determined whether or not an absolute value of the difference therebetween is greater than a predetermined threshold. The comparison with the predetermined threshold in step S43 is carried out by the module controller 401 serving as a determination unit. Further, the predetermined threshold used in step 43 may be set based on the difference between the DO driving time period Δt and the commanded opening time period Δtc obtained in the normal operation. For example, the predetermined threshold may be set based on the maximum value of the difference between the DO driving time period Δt and the commanded opening time period Δtc obtained in the normal operation. Such predetermined threshold may be the one that stored in the nonvolatile memory unit 407 in the module controller 401.

If it is determined that an absolute value of the difference between the DO driving time period Δt and the commanded opening time period Δtc is greater than the predetermined threshold (YES in step S43), there may be a software problem such as (1) a problem of a degree of time accuracy in the control software, (2) a signal delay in the I/O board 415 and so on. For example, in the module controller 401, a multi-task process in which multiple tasks are carried out at the same time by a plurality of software is performed. Therefore, if a task priority in the multi-task process is improperly set, the opening/closing timing in the CV solenoid DO signal, which is a control signal for opening and closing the chamber valve 37 at a high speed, may not correspond to the opening/closing timing set by the recipe. If such software problem is disregarded, the opening/closing operation of the chamber valve 37 is delayed in the actual operation, which makes it difficult to realize a highly reliable ALD process.

Therefore, if it is determined in step S43 that the absolute value of the difference between the DO driving time period Δt and the commanded opening time period Δtc is greater than the predetermined threshold, the module controller 401 may transmits a control signal to, e.g., stop an ALD process in the next step S44. Further, in step S44, another process such as a display of a warning notification on the display unit of the user interface 501 or the like may be carried out without immediately stopping the ALD process.

On the other hand, if it is determined that the absolute value of the difference between the DO driving time period Δt and the commanded opening time period Δtc is not greater than the predetermined threshold (NO in step S43), the process returns back to step S41. Then, the sequence shown in FIG. 16B is repeated, e.g., until a film forming process for a single wafer W is completed or until it is determined that the absolute value of the difference between the DO driving time period Δt and the commanded opening time period Δtc is greater than the predetermined threshold (YES in step S43).

As described above, the monitoring target is the commanded opening time period Δtc and/or the detected opening time period Δtd in the film forming apparatus of the present embodiment. Accordingly, it is possible to detect the symptom of failure of the chamber valve 37 before the chamber valve 37 becomes inoperable due to the failure thereof. Further, it is also possible to detect, in advance, an error in the operation command due to a defect in the software of the module controller 401, which is a higher-hierarchy control device in the control system. Further, since the monitoring target is the commanded opening time period Δtc and/or the detected opening time period Δtd of the chamber valve 37 repeatedly opened and closed at a high speed, in the present embodiment, the DO timer 451 and the DI timer 453 are provided in each of the I/O boards 415, which is a lower-hierarchy control device for controlling the input and output signals between the module controller 401 and the end devices 201. Thus, it becomes possible to reduce the communications data amount in the module controller 401 and to accurately obtain the opening time period of the chamber valve 37.

While the chamber valve 37 has been described above by way of example, the opening/closing operation statuses of the respective chamber valves 47, 57 and 67 can be determined in a similar manner by using the DO timer 451 and/or the DI timer 453.

With the present embodiment, the operation status of each of the chamber valves 37, 47, 57 and 67 can be detected based on the commanded opening time period Δtc measured by the DO timer 451 and/or the detected opening time period Δtd measured by the DI timer 453. By using the commanded opening time period Δtc and/or the detected opening time period Δtd, it becomes possible to detect the symptom of an abnormality (the degradation of components) and/or the software error that cannot be detected when the monitoring target is the opening/closing frequency of each of the chamber valves 37, 47, 57 and 67. It is therefore possible to avoid in advance the occurrence of a trouble in each of the chamber valves 37, 47, 57 and 67.

Other configurations and effects of the film forming apparatus of the present embodiment remain the same as those of the film forming apparatus of the first embodiment.

<Modification>

Figure 17:
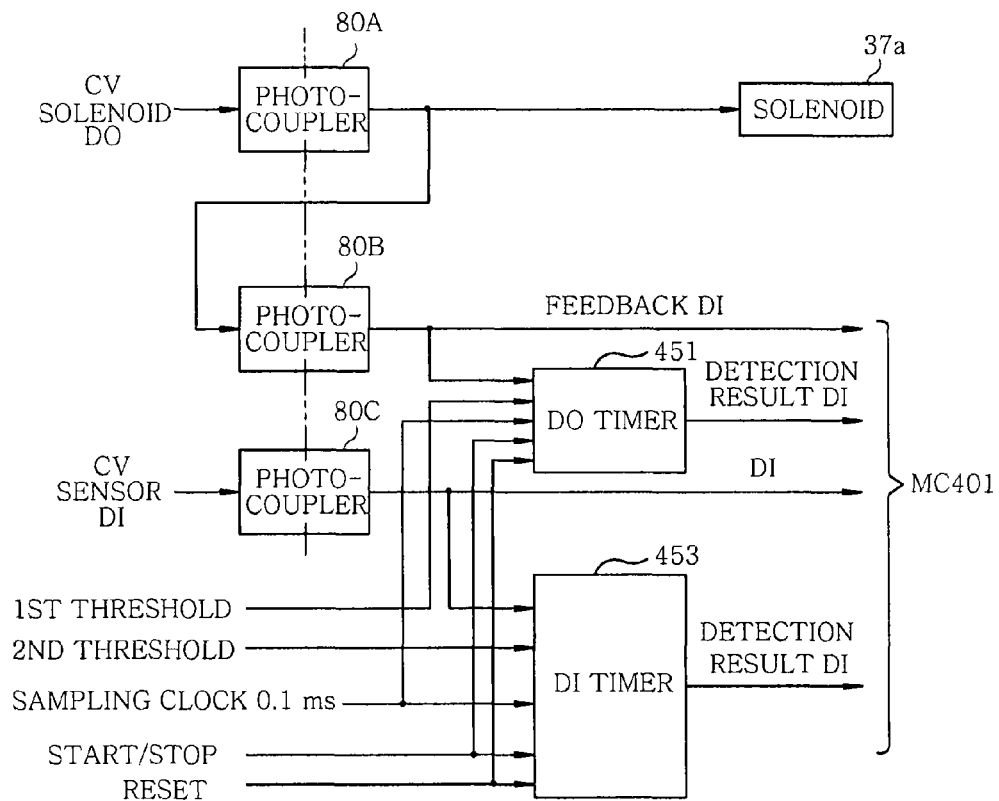
FIG. 17 is an explanatory view partially showing a control system including chamber valve opening time period timers in accordance with a modification of the fourth embodiment of the present invention

Next, a modification of the fourth embodiment will be described with reference to FIG. 17. In the present modification, the determination on the operation status of the chamber valve 37 and/or the determination on whether there is an error in the operation command due to a defect in the software of the module controller 401 can be made in the I/O board 415. More specifically, as shown in FIG. 17, thresholds used in such determinations described above are set in the I/O board 415, which is a lower-hierarchy control device compared to the module controller 401. The first threshold can be set in the DO timer 451 and the second threshold can be set in the DI timer 453. The first and the second threshold may be set to an equal value or different values.

The first threshold and/or the second threshold (including the setting range) set in the I/O board 415 are respectively inputted in the DO timer 451 and/or the DI timer 453, and the determinations are made in the DO timer 451 and/or the DI timer 453 through the sequence as that described above (e.g., in FIG. 16A). The determination result in the DO timer 451 and/or the determination result in the DI timer 453 are transmitted to the module controller 401 as DI information of the determination results, and the module controller 401 refers to the DI information of the determination results. If the abnormality is detected through the determination results, the module controller 401 may transmit a control signal to, e.g., stop the ALD process or to, e.g., display a notification of such abnormality on the display unit of the user interface 501.

As such, the I/O board 415 determines the operation status of each of the chamber valves 37, 47, 57 and 67 and/or whether there is an error in the operation command due to the defect in the software, so that it becomes possible to further reduce the communications data amount in the module controller 401 and to reduce a load of the software occurred when such determinations are made in the module controller 401.

While certain embodiments of the present invention have been described above, the present invention is not limited to the aforementioned embodiments but may be modified in many different forms. For example, the present invention is not limited to the semiconductor wafer but may be applied to, e.g., a processing apparatus for processing a large-size glass substrate for use in a liquid crystal display, an organic EL display, thin-film solar cell panel or the like.

While the invention has been shown and described with respect to the embodiments, it will be understood by those skilled in the art that various changes and modification may be made without departing from the scope of the invention as defined in the following claims.

What is claimed is:

1. A processing apparatus, comprising:
   a processing chamber configured to accommodate a target object to be processed;
   gas supply paths provided in a corresponding relationship with the kinds of process gases supplied into the processing chamber;
   valves respectively arranged in the gas supply paths to open and close the gas supply paths;
   valve drive units configured to independently drive the valves;
   sensor units configured to independently monitor opening and closing operations of the valves;
   a control unit configured to determine operation statuses of the valves based on valve opening and closing drive signals transmitted to the valve drive units and/or valve opening and closing detection signals transmitted from the sensor units;
   a first counter unit configured to acquire one or more valve opening and closing drive signals for each valve and count the number of the valve opening and closing drive signals for each valve; and
   a second counter unit configured to acquire one or more valve opening and closing detection signals for a sensor unit corresponding to each valve and count the number of the valve opening and closing detection signals for the corresponding sensor unit,
   wherein the control unit determines an operation status of each valve by referring to the counted numbers of the first and the second counter unit and
   wherein the control unit determines the operation status of each valve to be normal if the counted numbers of the first and the second counter unit are identical and determines the operation status of each valve to be abnormal if otherwise.

2. The processing apparatus of claim 1, wherein the control unit determines the operation status of each valve to be normal if the counted numbers of the first and the second counter unit are identical and determines the operation status of each valve to be abnormal if the difference between the counted numbers of the first and the second counter unit exceeds a predetermined threshold.

3. The processing apparatus of claim 1, wherein the first and the second counter unit are provided in a lower-hierarchy control device connected to the control unit of a higher-hierarchy control device to transmit and receive signals to and from the control unit, the lower-hierarchy control device being configured to control input and output signals between the control unit and end devices under the control of the control unit.

4. The processing apparatus of claim 1, further comprising:
   a counter configured to count time differences between one or more valve opening and closing drive signals for each valve and one or more valve opening and closing detection signals for a sensor unit corresponding to each valve,
   wherein the control unit determines an operation status of each valve by referring to the counted time differences.

5. The processing apparatus of claim 4, wherein the counted time differences are time differences between rising edges of the valve opening and closing drive signals for each valve and rising edges of the valve opening and closing detection signals for the corresponding sensor unit.

6. The processing apparatus of claim 5, wherein the control unit determines the operation status of each valve by referring to a maximum or a minimum of the counted time differences.

7. The processing apparatus of claim 4, wherein the counted time differences are time differences between falling edges of the valve opening and closing drive signals for each valve and falling edges of the valve opening and closing detection signals for the corresponding sensor unit.

8. The processing apparatus of claim 4, wherein the counter is provided in a lower-hierarchy control device connected to the control unit of a higher-hierarchy control device to transmit and receive signals to and from the control unit, the lower-hierarchy control device being configured to control input and output signals between the control unit and end devices under the control of the control unit.

9. The processing apparatus of claim 8, wherein the lower-hierarchy control device is configured to close at least one of the valves if one of the time differences between the valve opening and closing drive signals for each valve and the valve opening and closing detection signals for the corresponding sensor unit exceeds a predetermined threshold.

10. The processing apparatus of claim 1, further comprising;
    a counter unit configured to acquire the valve opening and closing detection signals transmitted from the sensor units, detect simultaneous opening of two or more of the valves and count the number of occurrences of the simultaneous opening,
    wherein the control unit determines the operation statuses of the valves by referring to the counted number of the occurrences.

11. The processing apparatus of claim 1, further comprising:
    a timer unit configured to acquire one or more valve opening and closing drive signals for each valve and measure a time period of each of the valve opening and closing drive signals for each valve,
    wherein the control unit determines an operation status of each valve by referring to the measured time period of the timer unit.

12. The processing apparatus of claim 1, further comprising:
    a timer unit configured to acquire one or more valve opening and closing detection signals for each sensor unit and measure a time period of each of the valve opening and closing detection signals for each sensor unit,
    wherein the control unit determines an operation status of each valve by referring to the measured time period of the timer unit.

13. The processing apparatus of claim 1, wherein the processing apparatus is an atomic layer deposition apparatus for forming a film on the target object by alternately supplying different kinds of gases.

* * * * *